US011456202B2

(12) United States Patent
Jung et al.

(10) Patent No.: US 11,456,202 B2
(45) Date of Patent: Sep. 27, 2022

(54) STAGE STRUCTURE FOR SEMICONDUCTOR FABRICATION PROCESS, SYSTEM OF PICKING UP SEMICONDUCTOR CHIP, AND METHOD OF CONTROLLING TILTING ANGLE OF PICKUP HEAD

(71) Applicant: Samsung Electronics Co., Ltd., Suwon-si (KR)

(72) Inventors: Jin-San Jung, Cheonan-si (KR); Hyunseok Choi, Ansan-si (KR); Jun-Su Lim, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/330,940

(22) Filed: May 26, 2021

(65) Prior Publication Data
US 2022/0130709 A1 Apr. 28, 2022

(30) Foreign Application Priority Data
Oct. 22, 2020 (KR) .......................... 10-2020-0137823

(51) Int. Cl.
*H01L 21/683* (2006.01)
*H01L 21/68* (2006.01)
*H01L 21/687* (2006.01)
*H01L 21/67* (2006.01)
*B05B 5/08* (2006.01)

(52) U.S. Cl.
CPC .......... *H01L 21/6838* (2013.01); *B05B 5/082* (2013.01); *H01L 21/67092* (2013.01); *H01L 21/68* (2013.01); *H01L 21/68707* (2013.01); *H01L 21/68785* (2013.01)

(58) Field of Classification Search
None
See application file for complete search history.

(56) References Cited

U.S. PATENT DOCUMENTS

| 3,568,307 | A | * | 3/1971 | Zanger | H01L 21/67144 228/49.1 |
| 7,500,503 | B2 | | 3/2009 | Giacona et al. | |
| 9,956,692 | B2 | | 5/2018 | Kostner et al. | |
| 2010/0122456 | A1 | * | 5/2010 | Yu | H01L 25/50 29/829 |

(Continued)

FOREIGN PATENT DOCUMENTS

| JP | 3381597 B2 | 3/2003 |
| JP | 3400735 B2 | 4/2003 |
| JP | 5580163 B2 | 8/2014 |

(Continued)

*Primary Examiner* — Charles Capozzi
(74) *Attorney, Agent, or Firm* — Harness, Dickey & Pierce, P.L.C.

(57) ABSTRACT

A stage structure for a semiconductor fabrication process is disclosed. The stage structure may include a stage and a pickup head tilting control device. The pickup head tilting control device may include a correction plate, a tilting driving device which is coupled to the correction plate and is configured to adjust an inclination angle of the correction plate, and a control circuitry configured to control the tilting driving device. The correction plate may include a correction surface which is selectively in contact with a suction surface of a pickup head.

16 Claims, 19 Drawing Sheets

(56) References Cited

U.S. PATENT DOCUMENTS

2020/0006099 A1* 1/2020 Yamauchi ............... H01L 24/81

FOREIGN PATENT DOCUMENTS

| KR | 10-2009-0113510 A | 11/2009 |
| --- | --- | --- |
| KR | 10-0953214 B1 | 4/2010 |
| KR | 10-2015-0089491 A | 8/2015 |
| KR | 10-2096583 B1 | 4/2020 |

* cited by examiner

STAGE STRUCTURE FOR SEMICONDUCTOR FABRICATION PROCESS, SYSTEM OF PICKING UP SEMICONDUCTOR CHIP, AND METHOD OF CONTROLLING TILTING ANGLE OF PICKUP HEAD

CROSS-REFERENCE TO RELATED APPLICATIONS

This U.S. non-provisional patent application claims priority under 35 U.S.C. § 119 to Korean Patent Application No. 10-2020-0137823, filed on Oct. 22, 2020, in the Korean Intellectual Property Office, the entire contents of which are hereby incorporated by reference.

BACKGROUND OF THE INVENTION

Some example embodiments relate to a stage structure for a semiconductor fabrication process, a system of picking up a semiconductor chip, and/or a method of controlling a tilting angle of a pickup head, and in particular, to a stage structure, which is used to adjust an inclination angle of a pickup head in a semiconductor fabrication process, a system of picking up a semiconductor chip using the same, and/or a method of controlling a tilting angle of a pickup head using the same.

A semiconductor package is configured to easily use a semiconductor chip as a part of an electronic product. In general, the semiconductor package includes a substrate, such as a printed circuit board (PCB), and a semiconductor chip mounted thereon. A plurality of semiconductor chips may be mounted in each semiconductor package. For example, a plurality of semiconductor chip may be sequentially stacked on each substrate. In order to mount the semiconductor chip on the substrate, picking up the semiconductor chip and placing the semiconductor chip on the substrate may be performed. A pickup tool is used for this process of placing the semiconductor chip on the substrate. Various pickup tools are used to pick up and deliver the semiconductor chip. For example, the pickup tool may be configured to catch the semiconductor chip using a vacuum pressure.

SUMMARY

Some example embodiments provide a stage structure, which can be used to align a suction surface of a pickup head to a horizontal direction in a semiconductor fabrication process, a system of picking up a semiconductor chip using the same, and a method of controlling a tilting angle of a pickup head using the same.

Some example embodiments provide a stage structure, which can be used to control a suction surface of a pickup head at various angles in a semiconductor fabrication process, a system of picking up a semiconductor chip using the same, and a method of controlling a tilting angle of a pickup head using the same.

Some example embodiments provides a stage structure, which can be used to increase a fabrication yield of a semiconductor package in a semiconductor fabrication process, a system of picking up a semiconductor chip using the same, and a method of controlling a tilting angle of a pickup head using the same.

Some example embodiments provides a stage structure, which can adjust a suction surface of a pickup head at various angles using the existing stage, in a semiconductor fabrication process, a system of picking up a semiconductor chip using the same, and a method of controlling a tilting angle of a pickup head using the same.

Some example embodiments provides a stage structure, which can be used for a semiconductor fabrication process and can be more easily manufactured, a system of picking up a semiconductor chip using the same, and a method of controlling a tilting angle of a pickup head using the same.

Some example embodiments provides a stage structure, which can be used to more precisely perform a bonding operation on a solder ball of a fine pitch in a semiconductor fabrication process, a system of picking up a semiconductor chip using the same, and a method of controlling a tilting angle of a pickup head using the same.

According to some example embodiments, a stage structure for a semiconductor fabrication process may include a stage, and a pickup head tilting control device. The pickup head tilting control device comprises a correction plate, a tilting driving device coupled to the correction plate and configured to adjust an inclination angle of the correction plate, and a control processing circuitry configured to control the tilting driving device. The correction plate comprises a correction surface which is selectively in contact with a suction surface of a pickup head.

According to some example embodiments, a system of picking up a semiconductor chip may include a pickup tool, and a pickup head tilting control device. The pickup tool comprises a pickup head configured to catch a semiconductor chip based on a suction, a tilting joint on the pickup head and coupled to the pickup head, and a driving device configured to move the pickup head. The pickup head comprises a suction surface configured to catch a semiconductor chip. The tilting joint includes a fixing member connected to the driving device, and a rotation member rotatably coupled to the fixing member. The pickup head is fixedly coupled to the rotation member, and the pickup head tilting control device comprises, a correction plate, and a tilting driving device coupled to the correction plate and configured to adjust an inclination angle of the correction plate, and the correction plate comprises a correction surface selectively in contact with the suction surface.

According to some example embodiments, a method of controlling a tilting angle of a pickup head may include determining an angle used in a suction surface of a pickup head, controlling a pickup head tilting control device based on information on the determined angle, and changing an angle of the suction surface using the pickup head tilting control device. The pickup head tilting control device includes, a correction plate, a tilting driving device coupled to the correction plate and configured to adjust an inclination angle of the correction plate, and a control circuitry configured to control the tilting driving device. The correction plate comprises a correction surface selectively in contact with the suction surface, the controlling of the pickup head tilting control device comprises adjusting the inclination angle of the correction plate using the tilting driving device controlled by the control circuitry, and the changing of the angle of the suction surface comprises bringing the suction surface in contact with the correction surface.

BRIEF DESCRIPTION OF THE DRAWINGS

Some example embodiments will be more clearly understood from the following brief description taken in conjunction with the accompanying drawings. The accompanying drawings represent non-limiting, some example embodiments as described herein.

DETAILED DESCRIPTION OF SOME EXAMPLE EMBODIMENTS

Figure 1:
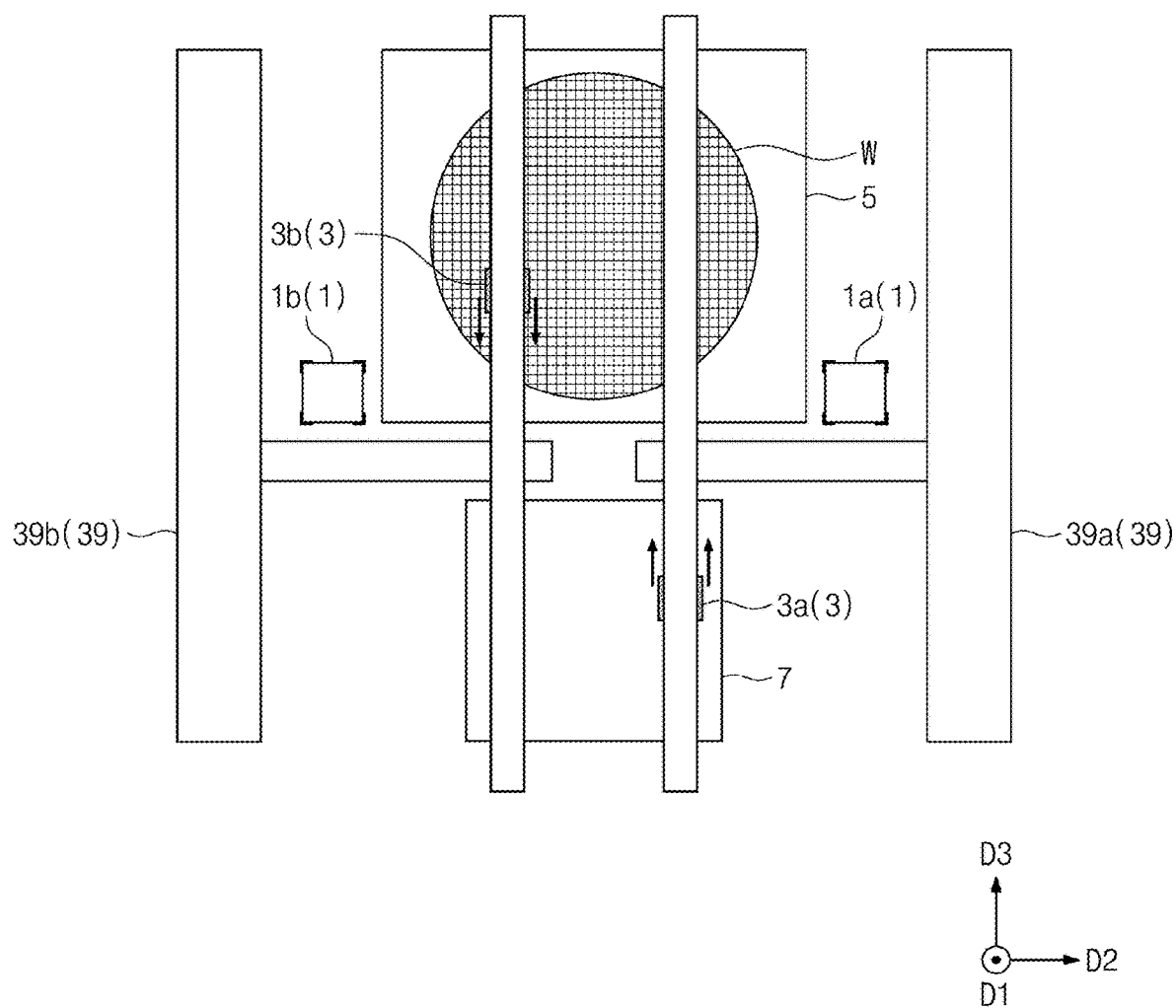
FIG. 1 is a schematic diagram illustrating a stage structure for a semiconductor fabrication process and a system of picking up a semiconductor chip, according to some example embodiments.

FIG. 1 is a schematic diagram illustrating a stage structure for a semiconductor fabrication process and a system of picking up a semiconductor chip, according to some example embodiments.

Hereinafter, the reference characters "D1" and "D2" of FIG. 1 will be referred to as first and second directions, respectively, and the reference character "D3", which is depicted to cross the first and second directions D1 and D2, will be referred to as a third direction. Each of the first direction D1, the second direction D2, and the third direction D3 may be perpendicular to each other; however, example embodiments are not limited thereto.

Referring to FIG. 1, a semiconductor fabrication system may be provided. The semiconductor fabrication system may include a loading portion 7, a stage 5, a pickup tool 3, a pickup head tilting control device 1, and so forth. In some example embodiments, the semiconductor fabrication system may further include a measurement portion 9 (e.g., see FIG. 10).

The loading portion 7 may be or include a structure, on which a semiconductor chip divided/sliced/sawed in the form of die will be placed. For example, a plurality of semiconductor chips may be placed on a top surface of the loading portion 7. The loading portion 7 may be or include a table. The pickup tool 3 may be used to pick up the semiconductor chip from the loading portion 7. The pickup tool 3 may be or include a robot.

The stage 5 may be used to perform a specific process on a semiconductor chip thereon. For example, a bonding process may be performed on a semiconductor chip loaded on the stage 5. For example, a substrate (e.g., a wafer W) may be placed on a top surface of the stage 5, and a semiconductor chip, which is loaded from the loading portion 7 by the pickup tool 3, may be bonded on the substrate. For example, the stage 5 may be used as a semiconductor chip bonding stage. The bonding process may include a thermal-compression (TC) bonding process, a reflow bonding process, or the like. However, example embodiments are not limited thereto, and in some example embodiments, the stage may be used to perform another process on the semiconductor chip.

The pickup tool 3 may be used to pick up a semiconductor chip and to unload the semiconductor chip on another element. For example, the pickup tool 3 may pick up a semiconductor chip from the loading portion 7 and may unload the semiconductor chip on the stage 5. In some example embodiments, two or more pickup tools 3 may be provided. For example, a first pickup tool 3a and a second pickup tool 3b may be provided for one stage 5. The first pickup tool 3a and the second pickup tool 3b may be placed on the stage 5 to be opposite to each other. The first pickup tool 3a and/or the second pickup tool 3b may be or may include a robot. The first pickup tool 3a may be configured to unload a semiconductor chip on a right portion of the wafer W disposed on the stage 5. The second pickup tool 3b may be configured to unload a semiconductor chip on a left portion of the wafer W disposed on the stage 5. The first pickup tool 3a may include a first driving portion 39a. A pickup head of the first pickup tool 3a may be moved in various directions by the first driving portion 39a. The second pickup tool 3b may include a second driving portion 39b. A pickup head of the second pickup tool 3b may be moved in various directions by the second driving portion 39b. The description that follows will refer to an example in which just one pickup tool 3 is provided, for the sake of brevity.

The pickup head tilting control device 1 may control an inclination angle of a pickup head of the pickup tool 3. The pickup head tilting control device 1 may be or include a leveler. The pickup head tilting control device 1 may be or may include a robot. The pickup head tilting control device 1 may be placed at various positions. For example, the pickup head tilting control device 1 may be located beside/adjacent/abutting the stage 5. For example, the pickup head tilting control device 1 and the stage 5 may be horizontally spaced apart from each other by a specific distance. However, example embodiments are not limited thereto, and in some example embodiments, the pickup head tilting control device 1 and the stage 5 may be in contact with or directly in contact with each other or may be formed as a single object. Alternatively, the pickup head tilting control device 1 may be disposed to maintain a specific distance from the pickup tool 3. For example, the pickup head tilting control device 1 may be disposed at a specific position that is spaced apart from the pickup tool 3 by a specific distance. In some example embodiments, two or more pickup head tilting control devices 1 may be provided. For example, a first pickup head tilting control device 1a and a second pickup head tilting control device 1b may be provided at both sides of one stage 5. The first pickup head tilting control device 1a and the second pickup head tilting control device 1b may be respectively placed at opposite sides of the stage 5. The first pickup head tilting control device 1a may be operated in a manner interworked with/coordinated with the first pickup tool 3a. For example, the first pickup head tilting control device 1a may be used to adjust an inclination angle of the pickup head of the first pickup tool 3a. The second pickup head tilting control device 1b may be operated in a manner interworked with the second pickup tool 3b. For example, the second pickup head tilting control device 1b may be used to adjust an inclination angle of the pickup head of the second pickup tool 3b. As described above, one pickup head tilting control device 1 has been described to be provided for one pickup tool 3, but example embodiments are not limited thereto. The description that follows will refer to an example in which just one pickup head tilting control device 1 is provided, for the sake of brevity.

The measurement portion 9 will be described in more detail with reference to FIGS. 10 and 11.

The structure including the pickup head tilting control device 1 and the stage 5 may be referred to as a stage structure for a semiconductor fabrication process. For example, the stage structure for a semiconductor fabrication process may mean or correspond to or include a stage structure including a mechanism that is configured to be able to adjust the inclination angle of the pickup head of the pickup tool 3. The stage structure for a semiconductor fabrication process may provide a space for a semiconductor fabrication process. For example, the stage structure for a semiconductor fabrication process may provide a space in which a bonding process on a semiconductor chip will be performed.

The structure including the pickup head tilting control device 1 and the pickup tool 3 may be referred to as a chip-pickup system. For example, the chip-pickup system may mean or correspond to or include a pickup system including a mechanism that is configured to be able to adjust the inclination angle of the pickup head of the pickup tool 3. The chip-pickup system may be configured to pick up and deliver a semiconductor chip, during a semiconductor fabrication process. For example, the chip-pickup system may be configured to pick up a semiconductor chip and then to place the semiconductor chip on a stage and/or on a flux dipping device, during a bonding process. This will be described in more detail below.

Figure 2:
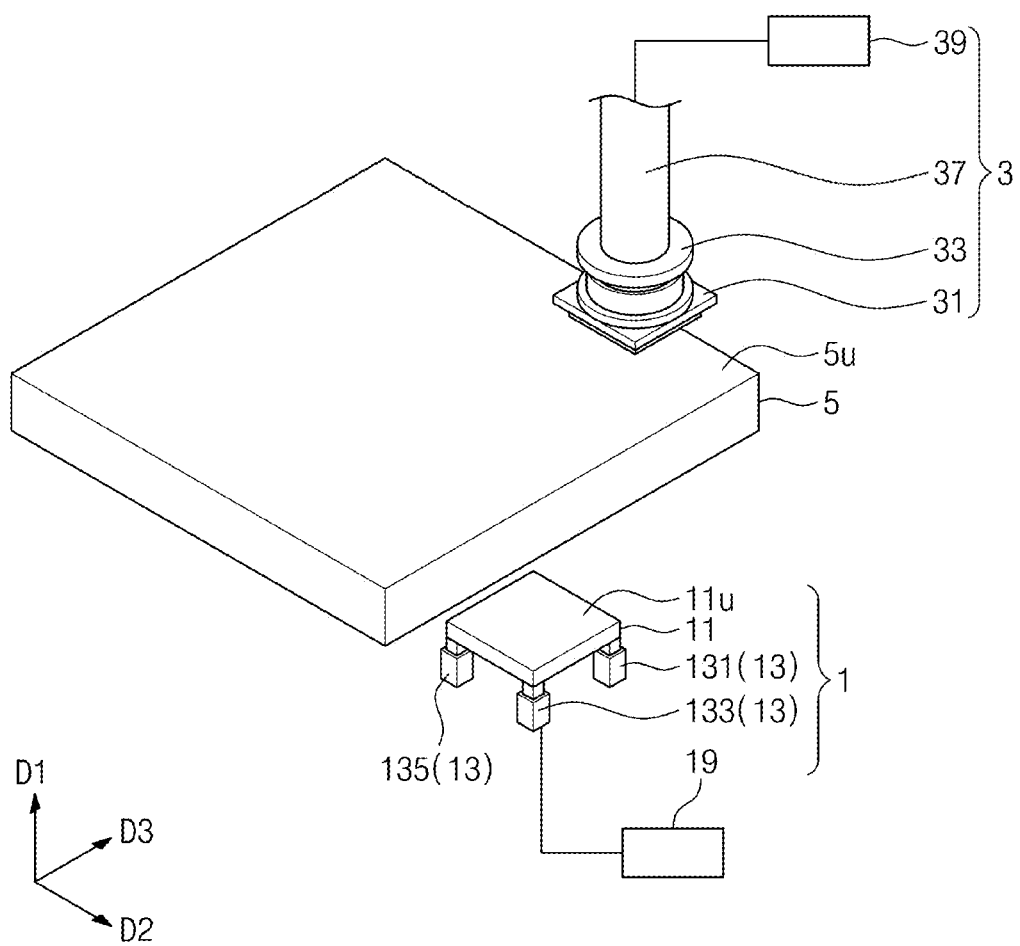
FIG. 2 is a perspective view illustrating a stage structure for a semiconductor fabrication process and a system of picking up a semiconductor chip, according to some example embodiments.
Figure 3:
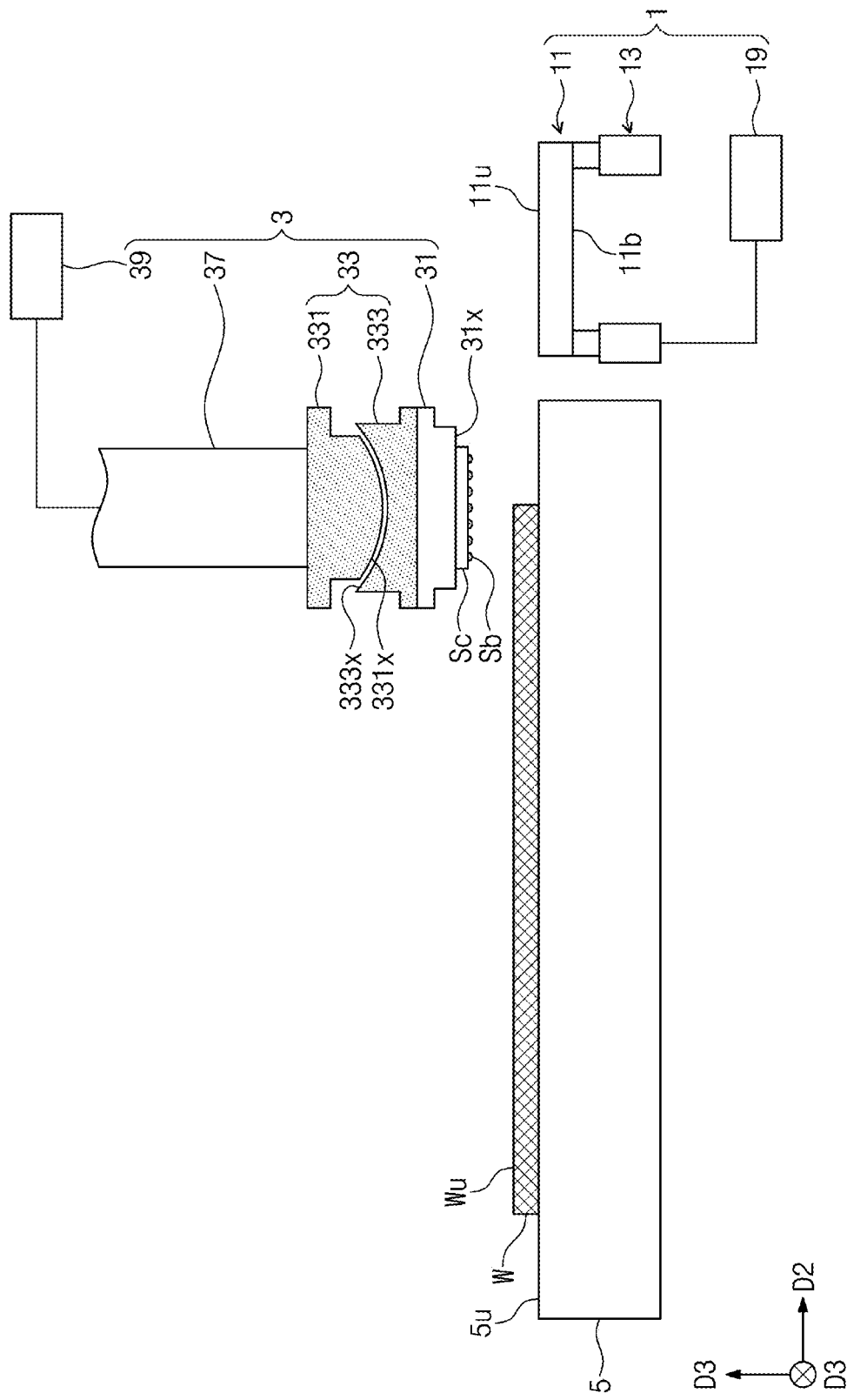
FIG. 3 is a sectional view illustrating a stage structure for a semiconductor fabrication process and a system of picking up a semiconductor chip, according to some example embodiments.

FIG. 2 is a perspective view illustrating a stage structure for a semiconductor fabrication process and a chip-pickup system, according to some example embodiments, and FIG. 3 is a sectional view illustrating a stage structure for a semiconductor fabrication process and a chip-pickup system, according to some example embodiments.

Referring to FIGS. 2 and 3, the pickup head tilting control device 1 may include a correction plate 11, a tilting driving portion 13, a control unit 19, and so forth.

The correction plate 11 may include a flat plate or a plate-shaped structure that may extend in the second direction D2 and the third direction D3. The correction plate 11 may be used to adjust an inclination angle of a pickup head 31. A top surface of the correction plate 11 may be referred to as a correction surface 11u. The correction surface 11u may include a flat surface. In some example embodiments, the correction surface 11u may be located at a level that is substantially the same as or similar to that of the top surface of the stage 5. However, example embodiments are not limited thereto. The correction plate 11 may further include a supporting surface 11b that is opposite to the correction surface 11u. The supporting surface 11b may mean or correspond to or include a bottom surface of the correction plate 11. The correction plate 11 may be supported by the tilting driving portion 13. The correction plate 11 may be formed of and/or include at least one of rigid materials. For example, the correction plate 11 may be formed of or include at least one of ceramic or metallic materials. The correction plate 11 may have a rectangular shape, such as a square shape, when viewed in plan view; however, example embodiments are not limited thereto, and the correction plate 11 may have a shape other than a rectangular shape when viewed in plan view, such as a polygonal shape and/or a circular shape.

The tilting driving portion 13 may be coupled with the correction plate 11. The tilting driving portion 13 may support the correction plate 11. The tilting driving portion 13 may be configured to adjust an inclination angle of the correction plate 11. Under the control the control unit 19, the tilting driving portion 13 may be driven in such a way that the correction plate 11 is inclined at an angle, e.g. at an angle relative to a floor on which the system sits. The tilting driving portion 13 may include an actuator. More specifically, the tilting driving portion 13 may include an actuator such as a linear actuator. For example, the actuator may include a Piezo actuator. The Piezo actuator may have a length that can be changed by a power supplied by the control unit 19. For example, in the case where the power is supplied to the tilting driving portion 13 from the control unit 19, the length of the Piezo actuator may be increased or decreased in the first direction D1. In some example embodiments, a plurality of actuators may be provided. For example, four actuators may be provided. The four actuators may be referred to as a first actuator 131, a second actuator 133, a third actuator 135, and a fourth actuator (not shown), respectively. Each of the four actuators may be coupled to the supporting surface 11b of the correction plate 11. The tilting driving portion 13 may adjust the inclination angle of the correction plate 11 in a manner of adjusting a length of each of the four actuators coupled to the supporting surface 11b of the correction plate 11.

The control unit 19 may control the tilting driving portion 13. For example, the control unit 19 may control a power, which is supplied to the tilting driving portion 13, to adjust a length of each actuator of the tilting driving portion 13. The inclination angle of the correction plate 11 may be changed by the control of the control unit 19. The control method of the control unit 19 will be described in more detail with reference to FIG. 4.

The pickup tool 3 may include the pickup head 31, a tilting member 33, a connecting member 37, a driving portion 39, and so forth.

The pickup head 31 may include a suction surface 31x. The suction surface 31x may mean or correspond to or include a bottom surface of the pickup head 31. A semiconductor chip SC may be in contact with/direct contact with the suction surface 31x in an attachable/detachable manner. The semiconductor chip SC may be attached to the suction surface 31x in various suction manners. For example, the semiconductor chip SC may be attached to the suction surface 31x by a vacuum pressure. The pickup head 31 may be configured to have a vacuum hole (not shown). The vacuum hole of the pickup head 31 may be connected to a vacuum pump (not shown). The vacuum hole may be exposed by the suction surface 31x. A top surface of the semiconductor chip SC may be attached to the suction surface 31x by a vacuum pressure exerted by the vacuum pump. The pickup head 31 may be formed of and/or include at least one of rigid materials. For example, the pickup head 31 may be formed of or include at least one of ceramic materials. The pickup head 31 may be rotatably coupled to the connecting member 37 by the tilting member 33. Thus, the pickup head 31 may rotate in place.

The tilting member 33 may connect the pickup head 31 to the connecting member 37. The tilting member 33 may be a tilting joint. The tilting member 33 may include a mechanism that is configured to be able to rotate the pickup head 31. For example, the tilting member 33 may include a fixing member 331 and a rotation member 333. The fixing member 331 and the rotation member 333 may be connected as a ball and socket connection. The fixing member 331 may be fastened to the connecting member 37. The rotation member 333 may be coupled to the pickup head 31. For example, the rotation member 333 may be fixedly coupled to a top surface of the pickup head 31. The rotation member 333 may be rotatably coupled to the fixing member 331. The rotation member 333 may be configured to rotate relative to the fixing member 331. For example, the rotation member 333 may be configured to rotate about an axis of the second direction D2 and/or the third direction D3 relative to the fixing member 331. The fixing member 331 may include a first correction curved surface 331x. The first correction curved surface 331x may be a bottom surface of the fixing member 331. The first correction curved surface 331x may include a curved (e.g., downwardly-convex) surface. In some example embodiments, the first correction curved surface 331x may have a specific curvature. For example, the first correction curved surface 331x may be a part of, such as a convex part of, a spherical surface. The rotation member 333 may include a second correction curved surface 333x. The second correction curved surface 333x may be a top surface of a rotation member 332. A second correction curved surface 332x may include a curved (e.g., downwardly-concave) surface. The second correction curved surface 333x may face the first correction curved surface 331x. In some example embodiments, the second correction curved surface 333x may have a specific curvature. For example, the second correction curved surface 333x may be a part of a spherical surface. In some example embodiments, the curvature of the second correction curved surface 333x may be substantially equal or similar to the curvature of the first correction curved surface 331x. The rotation member 333 may rotate about the fixing member 331 while a distance between the first and second correction curved surfaces 331x and 333x is maintained to a constant value. The rotation member 333 may include various mechanisms which can be rotatably coupled to the fixing member 331. For example, while the rotation member 333 and the fixing member 331 are coupled to each other by a vacuum pressure, the rotation member 333 may rotate relative to the fixing member 331. For this, a vacuum hole (not shown) may be provided in the fixing member 331 and/or the rotation member 333. However, example embodiments are not limited thereto, and the rotation member 333 may be rotatably coupled to the fixing member 331 in other manners.

The connecting member 37 may be coupled to an upper portion of the fixing member 331. The connecting member 37 may connect the driving portion 39 to the tilting member 33. The connection member 37 may be or include an arm of a robot.

The driving portion 39 may be configured to move the pickup head 31. For example, the driving portion 39 may be configured to move the pickup head 31 in the first direction D1, the second direction D2, and/or the third direction D3. For this, the driving portion 39 may be or include a motor such as an electric motor and/or a hydraulic motor and/or a pneumatic motor and/or the like.

The wafer W may be disposed on a top surface 5u of the stage 5. The pickup tool 3 may be used to place the semiconductor chip SC, which is attached to the suction surface 31x of the pickup head 31, on the wafer W. A solder ball Sb of the semiconductor chip SC may be in contact with, e.g. in direct contact with, a top surface Wu of the wafer W.

Figure 4:
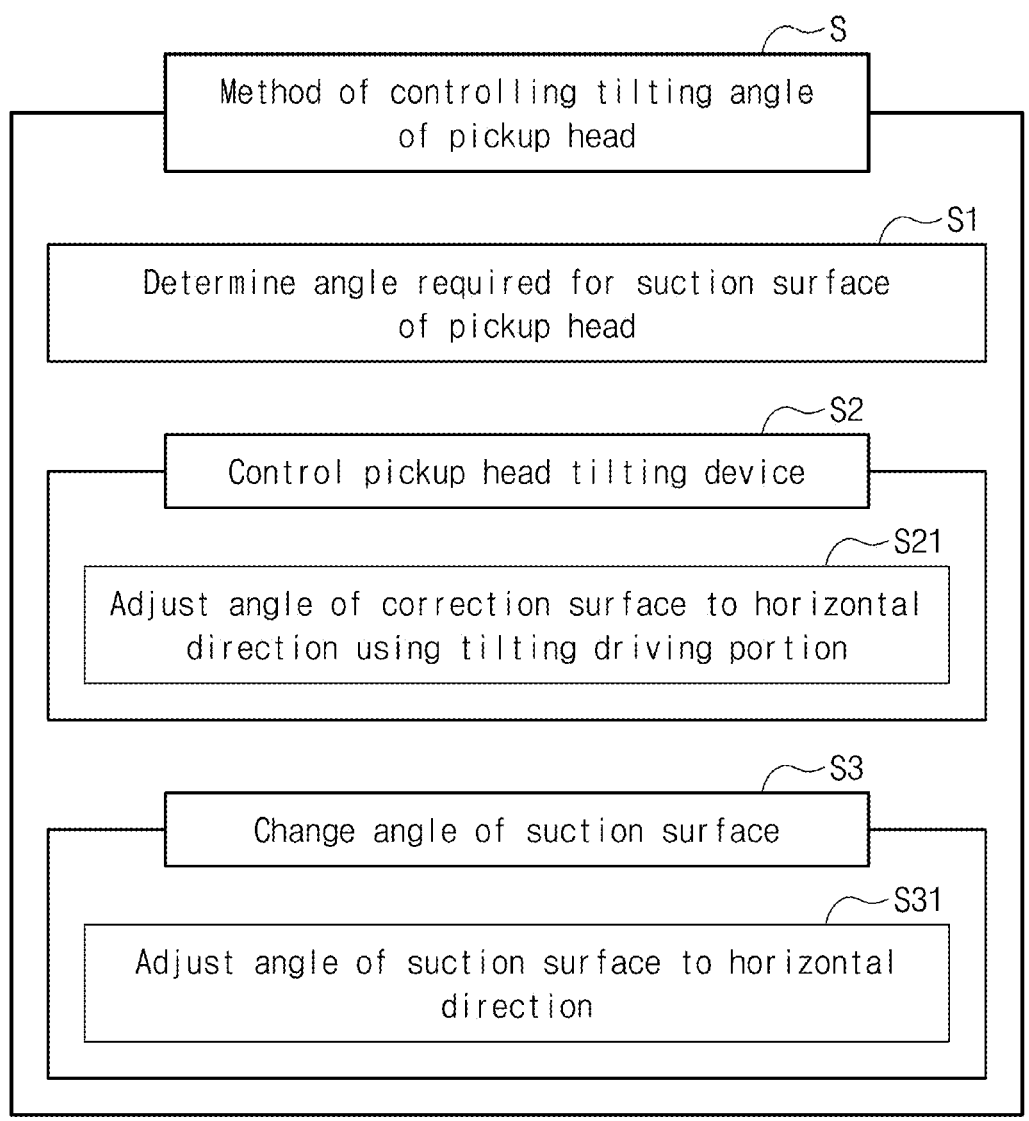
FIG. 4 is a flow chart illustrating a method of controlling a tilting angle of a pickup head, according to some example embodiments.

FIG. 4 is a flow chart illustrating a method of controlling a tilting angle of a pickup head, according to some example embodiments.

Referring to FIG. 4, a method of controlling a tilting angle of a pickup head S may be provided. The tilting angle controlling method S may mean or correspond to or include a method of adjusting an inclination angle of the pickup head 31 of the pickup tool 3 (e.g., see FIG. 2) using the pickup head tilting control device 1 (e.g., see FIG. 2) described with reference to FIG. 1.

The tilting angle controlling method S may include determining an angle required or used for or desired for the suction surface of the pickup head (in S1), controlling a pickup head tilting device (in S2), and changing an angle of a suction surface (in S3).

The controlling of the pickup head tilting device (in S2) may include adjusting an angle of a correction surface to a horizontal direction using a tilting driving portion (in S21).

The changing of the angle of the suction surface (in S3) may include adjusting the angle of the suction surface to the horizontal direction (in S31).

Hereinafter, each step of the tilting angle controlling method S will be described in more detail with reference to FIGS. 4 to 7.

Figure 5:
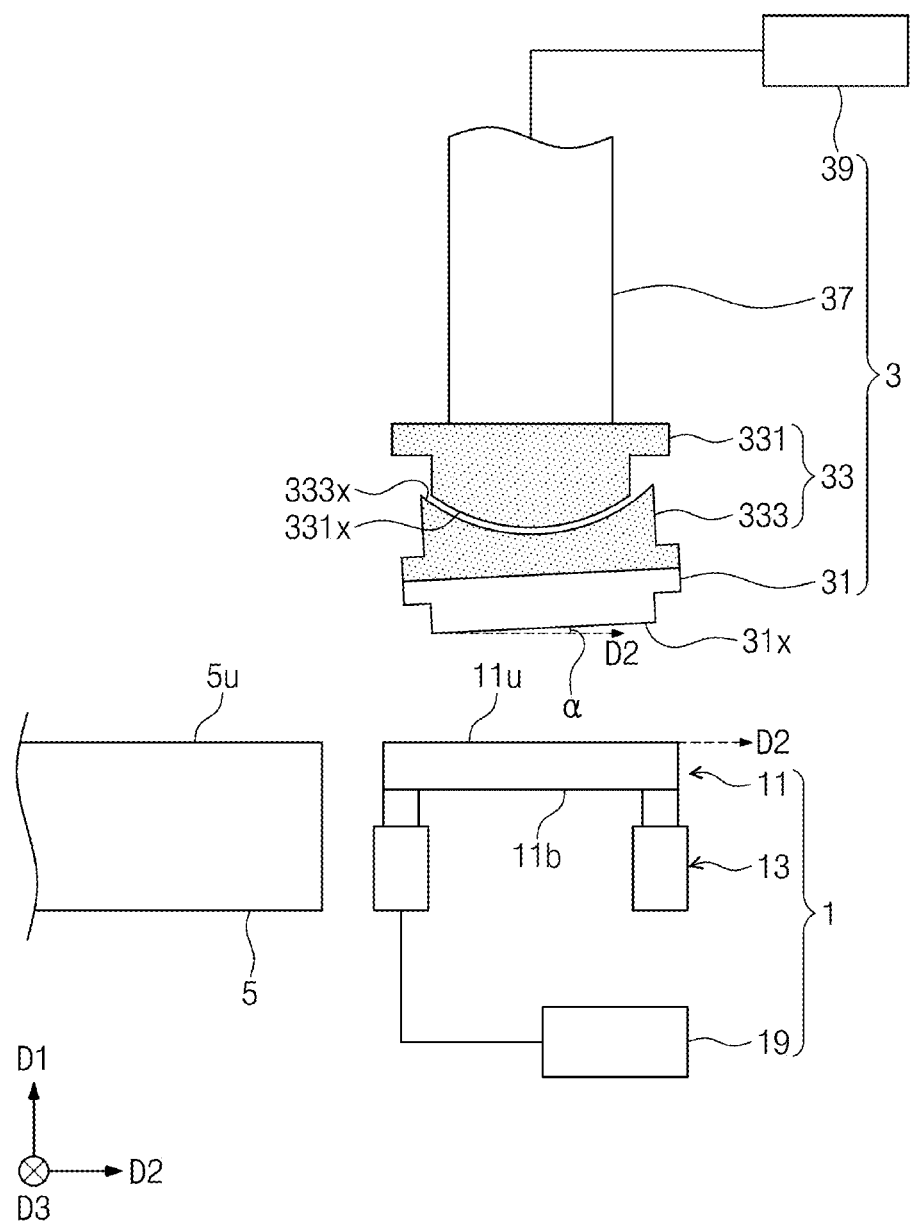
FIGS. 5 to 7 are side views sequentially illustrating a process of controlling an inclination angle of a pickup head using the method of FIG. 4.
Figure 6:
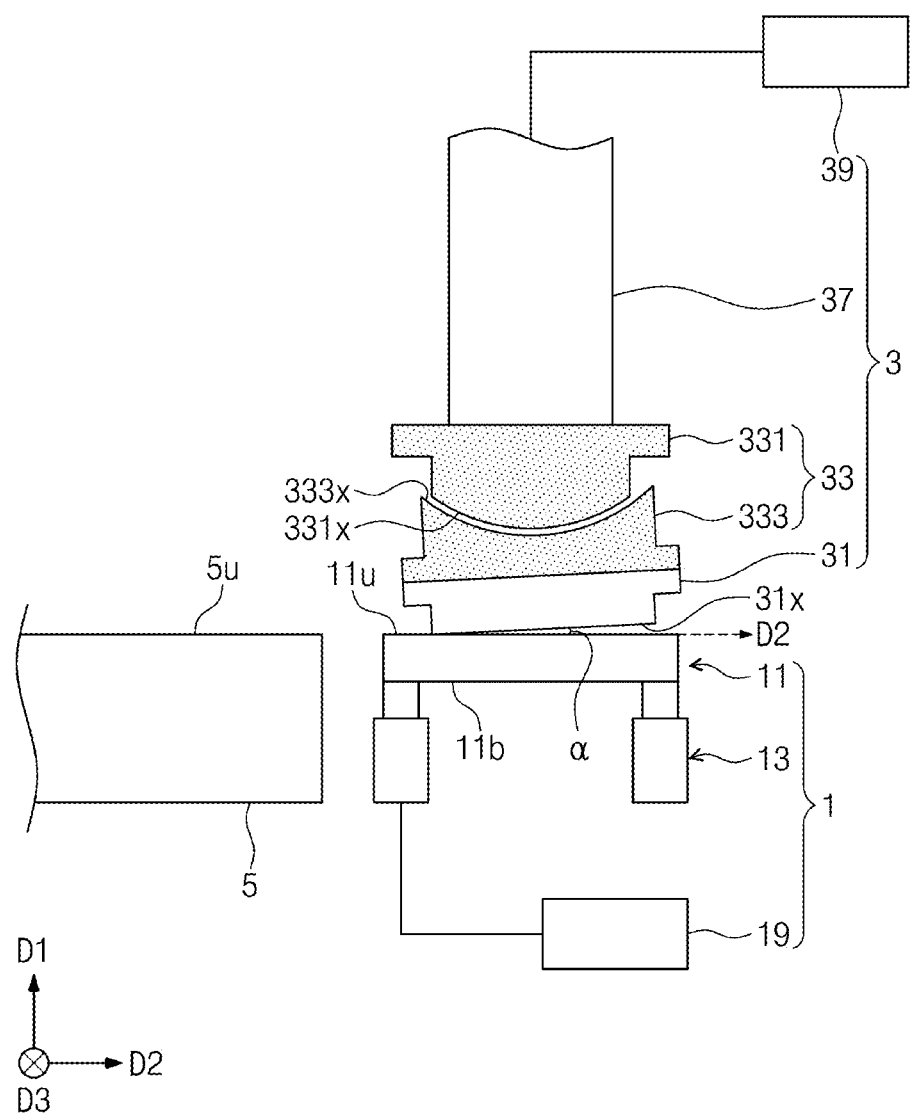
Figure 7:
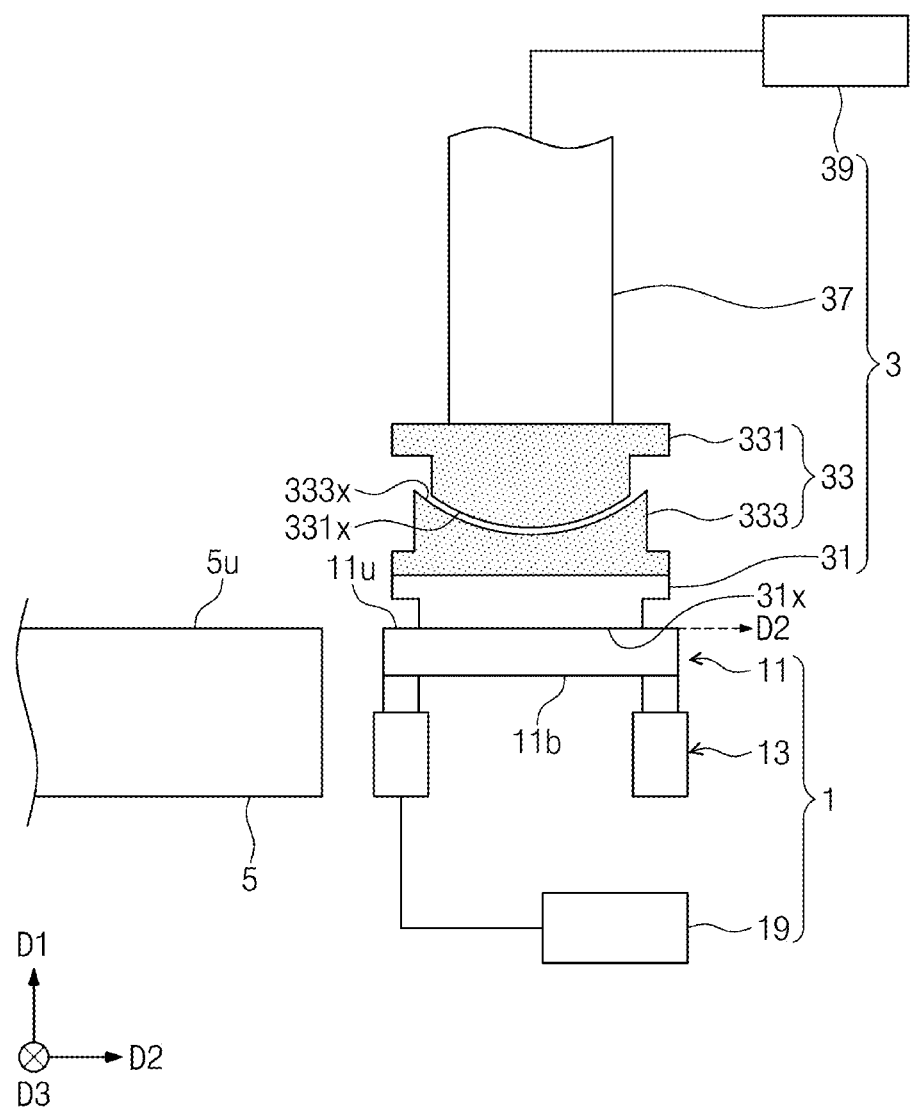

FIGS. 5 to 7 are side views sequentially illustrating a process of controlling an inclination angle of a pickup head using the method of FIG. 4.

Referring to FIGS. 5 and 4, the determining of the required angle for the suction surface of the pickup head (in S1) may include determining an angle, which is required to or used during or desired for the suction surface 31x of the pickup head 31, through the control unit 19. For example, the suction surface 31x of the pickup head 31 should or could or can be aligned to the horizontal direction. In this case, the control unit 19 may set a target angle of the suction surface 31x of the pickup head 31 to be aligned to the horizontal direction. The horizontal direction may mean a direction on a plane that is parallel to the second and third directions D2 and D3. For example, the horizontal direction may mean or correspond to or indicate a direction that is perpendicular to the first direction D1.

The pickup head 31 may be inclined. Accordingly, the suction surface 31x may also be inclined. The pickup head 31 may be inclined by various causes. For example, the pickup head 31 may be inclined during an operation of applying or removing a vacuum pressure. Alternatively or additionally, in the case where the pickup head 31 is in contact with the stage or the like, the pickup head 31 may be inclined by an uneven structure on the stage. As a result of the inclination of the pickup head 31, the suction surface 31x may form a first angle α relative to the second direction D2. The first angle α may be greater than 0°.

The adjusting of the angle of the correction surface to the horizontal direction using the tilting driving portion (in S21) may include controlling the tilting driving portion 13 through the control unit 19. The tilting driving portion 13 may be moved under the control of the control unit 19 to align the correction surface 11u to the horizontal direction. For example, the control unit 19 may control each or at least one actuator of the tilting driving portion 13 to allow all of the actuators to have the same length. In the case where the actuators have the same length, the correction surface 11u may be aligned to the horizontal direction. For example, the correction surface 11u may be parallel to the second direction D2 and the third direction D3. Alternatively or additionally, in the case where there is an uneven structure on the correction surface 11u, it may be necessary or desirable to slant the correction surface 11u to align the suction surface 31x of the pickup head 31 to the horizontal direction, and in this case, the control unit 19 may control the actuators to have different lengths. For example, the control unit 19 may examine surface roughness of the correction surface 11u. If information on the surface roughness of the correction surface 11u is obtained, the control unit 19 may set the lengths of the actuators to different values, based on the information. For example, the information on the surface roughness of the correction surface 11u may be used to change an inclination angle of the correction plate 11, such that the suction surface 31x in contact with the correction surface 11u becomes parallel to the horizontal direction. For example, due to the uneven structure on the correction surface 11u, it may be difficult or challenging to align the suction surface 31x in contact with the correction surface 11u to the horizontal direction, even when the correction surface 11u is aligned to the horizontal direction, but even in such a case, by using the information on the surface roughness of the correction surface 11u, the control unit 19 may adjust the lengths of the actuators, such that align the suction surface 31x is aligned to the horizontal direction.

Referring to FIGS. 6, 7, and 4, the adjusting of the angle of the suction surface to the horizontal direction (in S31) may include downwardly moving the pickup head 31 using the driving portion 39. If the pickup head 31 is moved in a downward direction, the suction surface 31x may be in contact with the correction surface 11u. The suction surface 31x may be rotated to have the same angle as the correction surface 11u. More specifically, if the correction surface 11u aligned to the horizontal direction exerts an upward force on the inclined suction surface 31x, the pickup head 31 may be rotated. The rotation of the pickup head 31 may be achieved as a result of the rotation of the rotation member 333 about the fixing member 331. The downward movement of the pickup head 31 may continue until the suction surface 31x is fully in contact with, e.g. in direct contact with, the correction surface 11u. The suction surface 31x may have the same inclination angle as the correction surface 11u. In the case where the correction surface 11u is aligned to the horizontal direction, the suction surface 31x may also be aligned to the horizontal direction.

Figure 8:
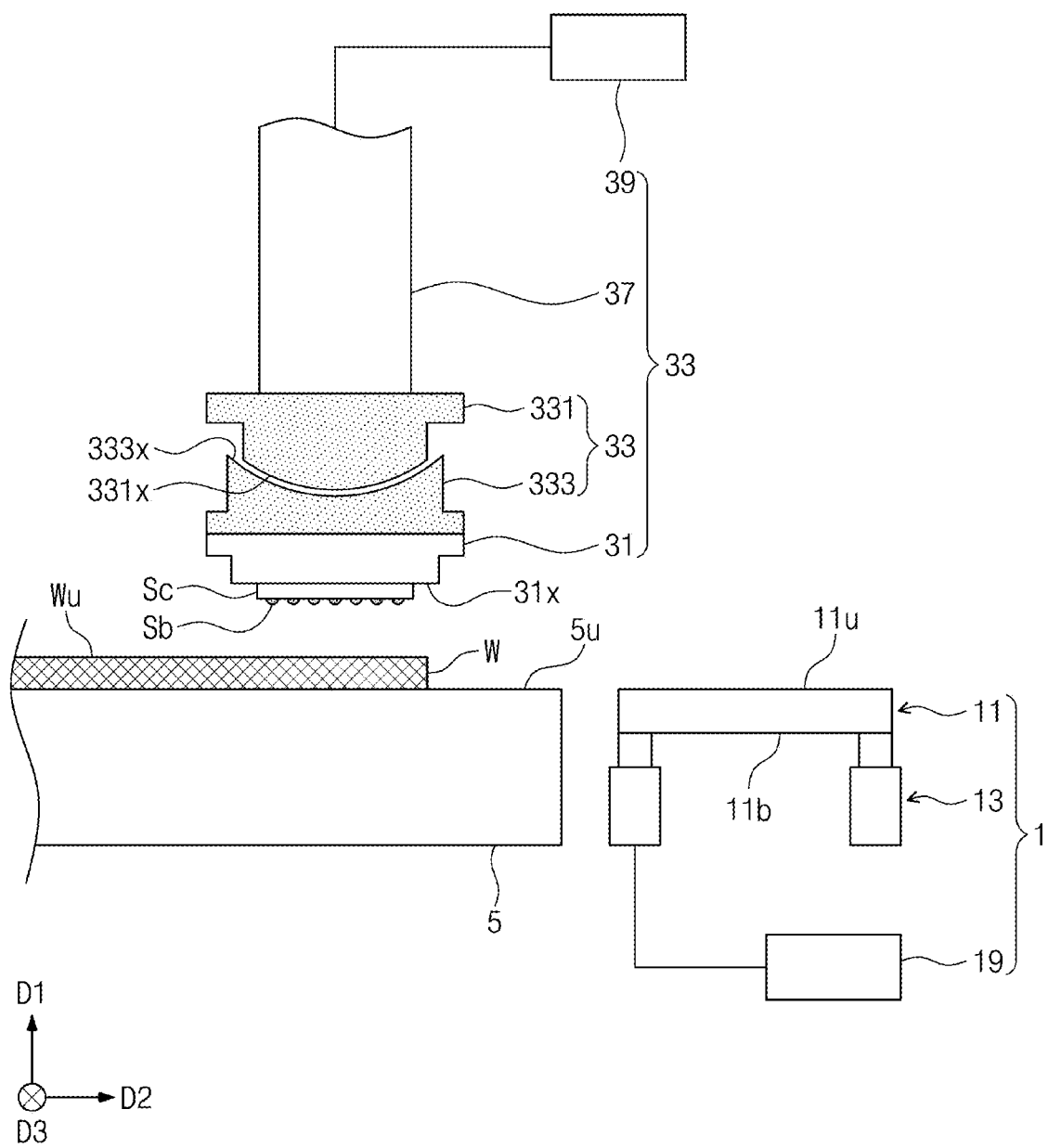
FIG. 8 is a sectional view illustrating a process of placing a semiconductor chip, using a pickup head whose inclination angle is adjusted by the method of FIG. 4.

FIG. 8 is a sectional view illustrating a process of placing a semiconductor chip, using a pickup head whose inclination angle is adjusted by the method of FIG. 4.

Referring to FIG. 8, the pickup tool 3 may catch the semiconductor chip SC with a suction/in a suction manner. Since the suction surface 31x of the pickup head 31 is aligned to the horizontal direction by the pickup head tilting control device 1, the semiconductor chip SC caught to the suction surface 31x may also become in a horizontal state. The pickup tool 3 may mount the semiconductor chip SC on the top surface Wu of the wafer W while maintaining the semiconductor chip SC in the horizontal state.

In a stage structure for a semiconductor fabrication process, a chip-pickup system, and a method of controlling a tilting angle of a pickup head according to some example embodiments, it may be possible to align the suction surface of the pickup head, which is used to catch a semiconductor chip in the suction manner, to the horizontal direction. The suction surface of the pickup head may be aligned to the horizontal direction, in advance before catching the semiconductor chip in the suction manner. Thus, the semiconductor chip caught by the suction surface may also be aligned to the horizontal direction. The semiconductor chip in a horizontal state may be disposed on the substrate (e.g., the wafer). Thus, a solder ball of the semiconductor chip may be bonded to a substrate, without any defect or with a reduction in defects therebetween. For example, it may be possible to prevent or reduce the likelihood of a short-circuit or non-wetting issue from occurring in the solder ball. Accordingly, it may be possible to improve a fabrication yield of a semiconductor package.

In a stage structure for a semiconductor fabrication process, a chip-pickup system, and a method of controlling a tilting angle of a pickup head according to some example embodiments, an additional pickup head tilting control device, in addition to or alternative to a stage, may be used to adjust the inclination angle of the pickup head. Thus, even when the stage has an uneven surface, it may be possible to precisely control or more precisely control the inclination angle of the pickup head.

In a stage structure for a semiconductor fabrication process, a chip-pickup system, and a method of controlling a tilting angle of a pickup head according to some example embodiments, a precisely adjusted or more precisely adjusted pickup head may be used to place a semiconductor chip at a desired position, and thus, it may be possible to realize a higher fabrication yield, even when the solder ball of the semiconductor chip has a fine pitch. For example, it may be possible to provide the solder balls at a fine pitch.

In a stage structure for a semiconductor fabrication process, a chip-pickup system, and a method of controlling a tilting angle of a pickup head according to some example embodiments, an inclination angle of the pickup head may be easily controlled or more easily controlled by a simple method of disposing just a pickup head tilting control device near a stage but using the existing stage as it is. Thus, it may be possible to align the pickup head, without a substantial change in structure of the stage. In this case, a semiconductor fabrication system may be manufactured by a simplified method.

In a stage structure for a semiconductor fabrication process, a chip-pickup system, and a method of controlling a tilting angle of a pickup head according to some example embodiments, the inclination angle of the pickup head may be adjusted by a part, which is provided outside the pickup tool, and separate from by the pickup tool. Thus, it may be unnecessary to provide an additional driving portion, which is used to rotate the pickup head, in the pickup tool. Accordingly, the pickup tool may be provided to have a reduced weight.

Figure 9:
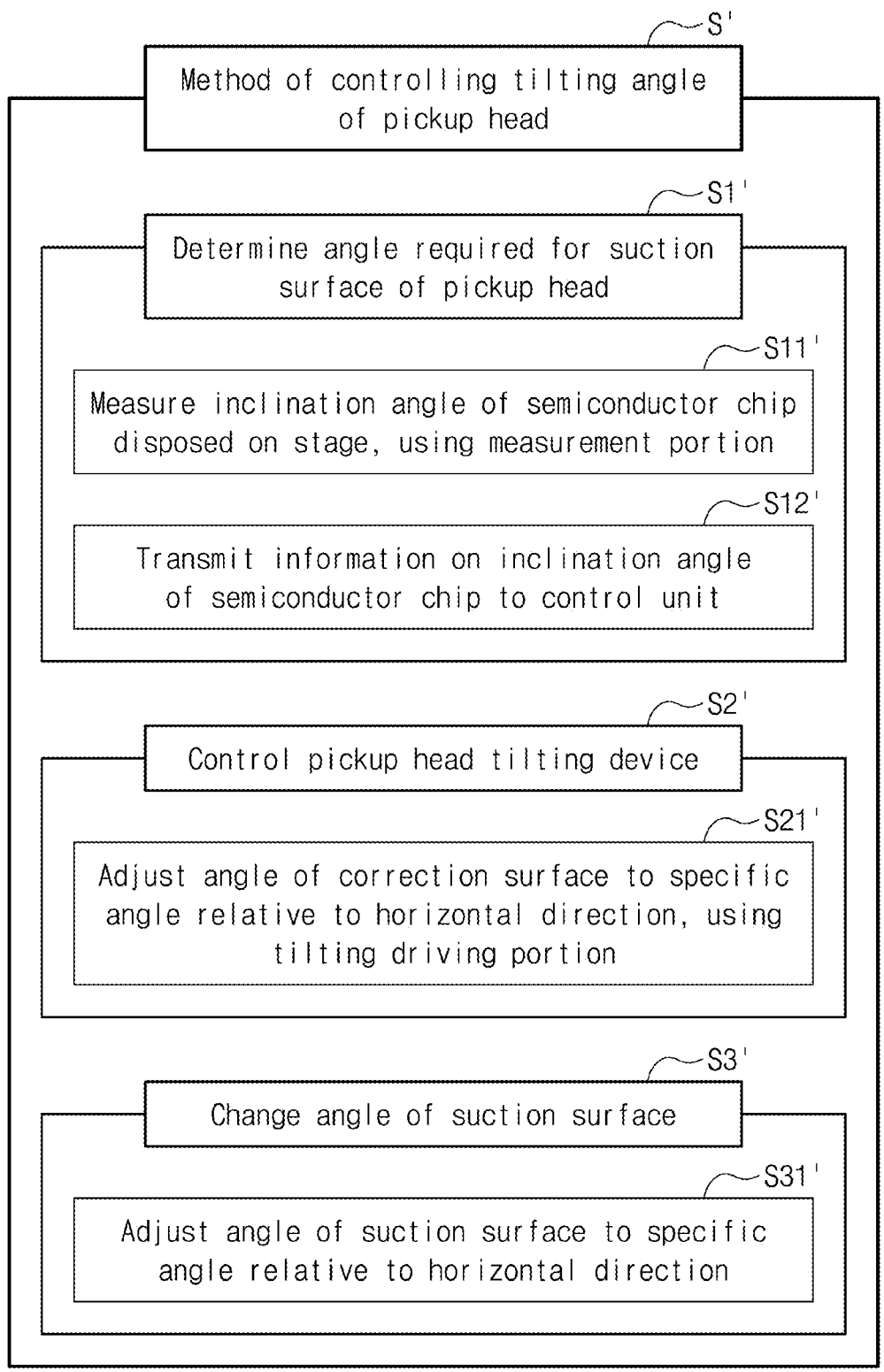
FIG. 9 is a flow chart illustrating a method of controlling a tilting angle of a pickup head, according to some example embodiments.

FIG. 9 is a flow chart illustrating a method of controlling a tilting angle of a pickup head, according to some example embodiments.

Referring to FIG. 9, a method of controlling a tilting angle of a pickup head S' may be provided. The tilting angle controlling method S' of FIG. 9 may be different from the tilting angle controlling method S described with reference to FIG. 4.

The tilting angle controlling method S' may include determining an angle required for the suction surface of the pickup head (in S1'), controlling a pickup head tilting device (in S2'), and changing an angle of the suction surface (in S3').

The determining of the angle required for the suction surface of the pickup head (in S1') may include measuring an inclination angle of a semiconductor chip disposed on a stage, using a measurement portion (in S11') and transmitting information on the inclination angle of the semiconductor chip to a control unit (in S12').

The controlling of the pickup head tilting device (in S2') may include adjusting an angle of a correction surface to a specific angle relative to the horizontal direction, using a tilting driving portion (in S21').

The changing of the angle of the suction surface (in S3') may include adjusting the angle of the suction surface to a specific angle relative to the horizontal direction (in S31').

Hereinafter, each step of the tilting angle controlling method S' will be described in more detail with reference to FIGS. 10 to 13.

FIGS. 10 to 13 are perspective and side views sequentially illustrating a process of controlling an inclination angle of a pickup head using the method of FIG. 9.

Figure 10:
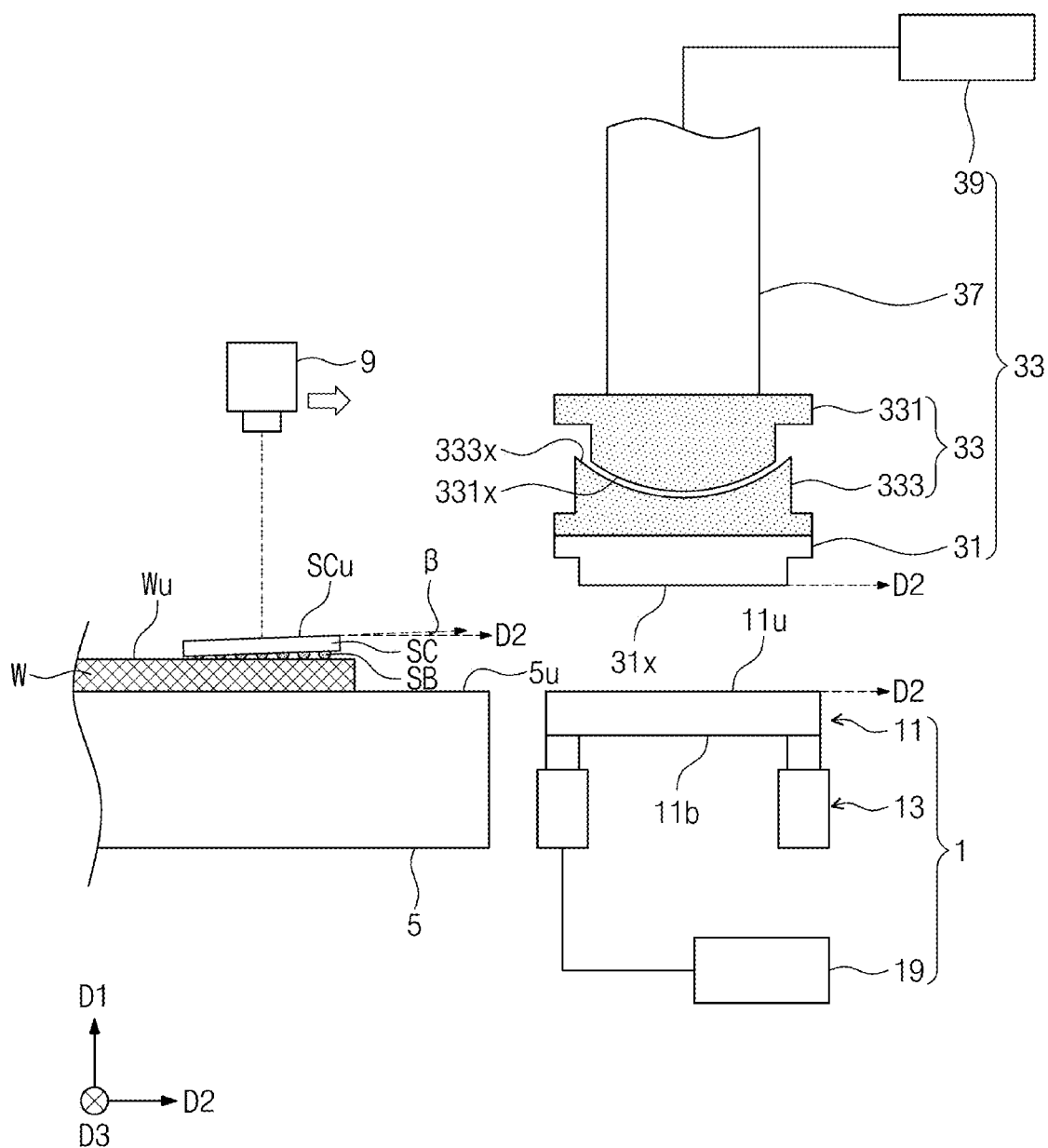
FIGS. 10 to 13 are perspective and side views sequentially illustrating a process of controlling an inclination angle of a pickup head using the method of FIG. 9.

Referring to FIGS. 10 and 9, the measuring of the inclination angle of the semiconductor chip, which is disposed on the stage, using the measurement portion (in S11') may include obtaining information on an inclination angle of the semiconductor chip SC, which is placed on the stage 5, using the measurement portion 9. At least one semiconductor chip SC may be already placed on the wafer W. The semiconductor chip SC may be placed on the wafer W using the pickup tool 3 or the like. The semiconductor chip SC, which is previously placed on the wafer W, may be inclined. For example, a top surface SCu of the semiconductor chip SC may be inclined to form a second angle β relative to the horizontal direction. In this case, the arrangement of the solder balls Sb may be inclined. Furthermore, owing to various causes, the semiconductor chip SC may be placed on the wafer W to be in an inclined state. If it is necessary to stack an additional semiconductor chip on the semiconductor chip SC disposed on the wafer W, it may be necessary or desirable to dispose the additional semiconductor chip to have the same inclination angle as the previously-placed semiconductor chip SC. The measurement portion 9 may be used to collect information on the inclination angle of the semiconductor chip SC. For example, the measurement portion 9 may include an optical sensor and/or a laser sensor, which is used to measure the inclination of the semiconductor chip SC. More specifically, the measurement portion 9 may be configured to emit light toward the top surface SCu of the semiconductor chip SC and to sense light reflected by the top surface SCu, and a distance to the semiconductor chip SC may be determined based on information on the emitted and received lights. The measurement portion 9 may be laterally moved to repeat the same operation. Accordingly, the measurement portion 9 may determine the extent of the inclination of the semiconductor chip SC. For example, by the measurement operation executed by the measurement portion 9, it may be possible to find that the top surface SCu of the semiconductor chip SC is inclined at the second angle β relative to the horizontal direction.

The transmitting of the information on the inclination angle of the semiconductor chip to the control unit (in S12') may include transmitting the information on the inclination angle of the semiconductor chip SC, which is obtained by the measurement portion 9, to the control unit 19. The control unit 19 may determine an inclination angle required for the pickup head 31, based on the information on the inclination angle of the previously-placed semiconductor chip SC.

Figure 11:
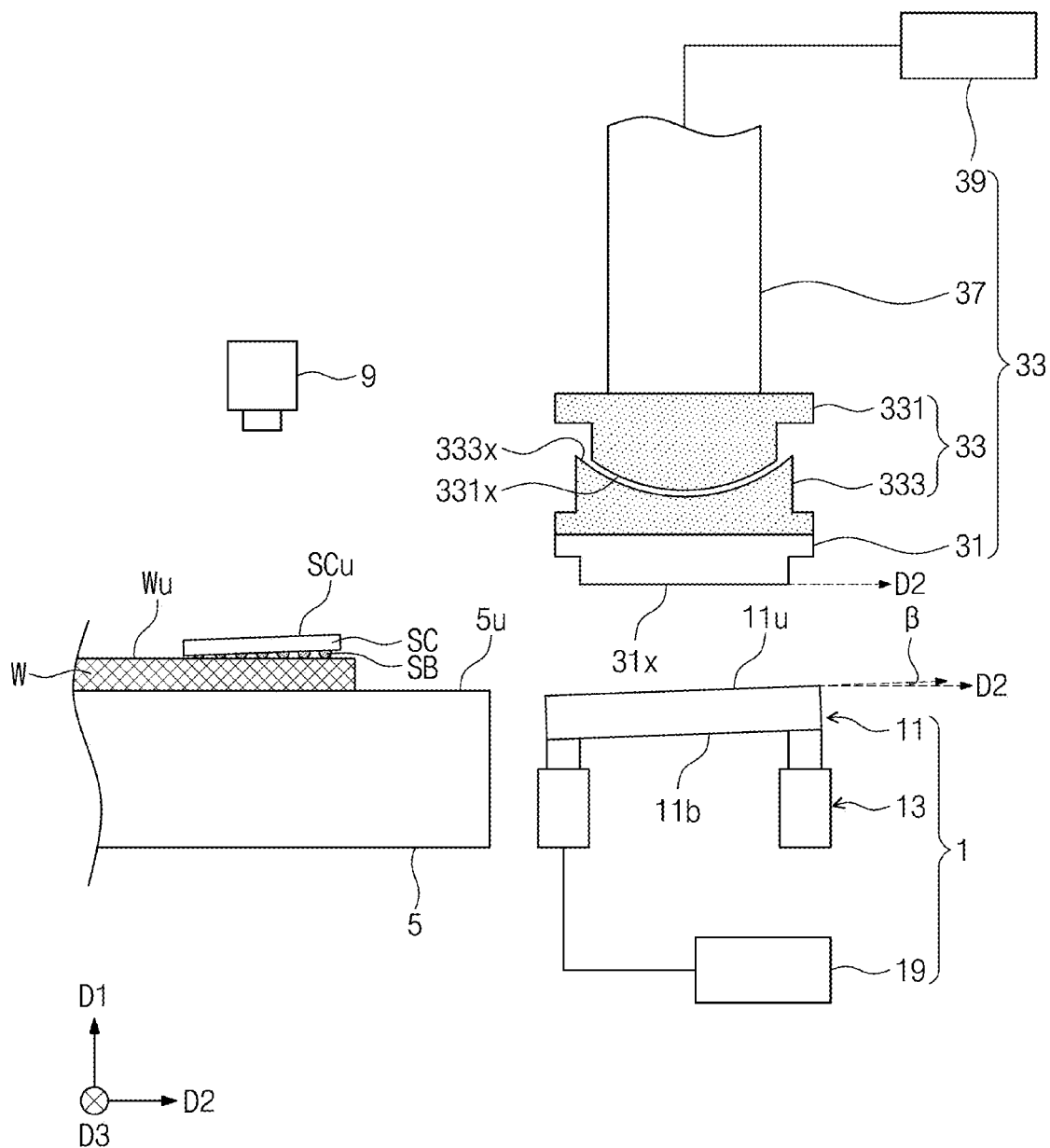
Figure 12:
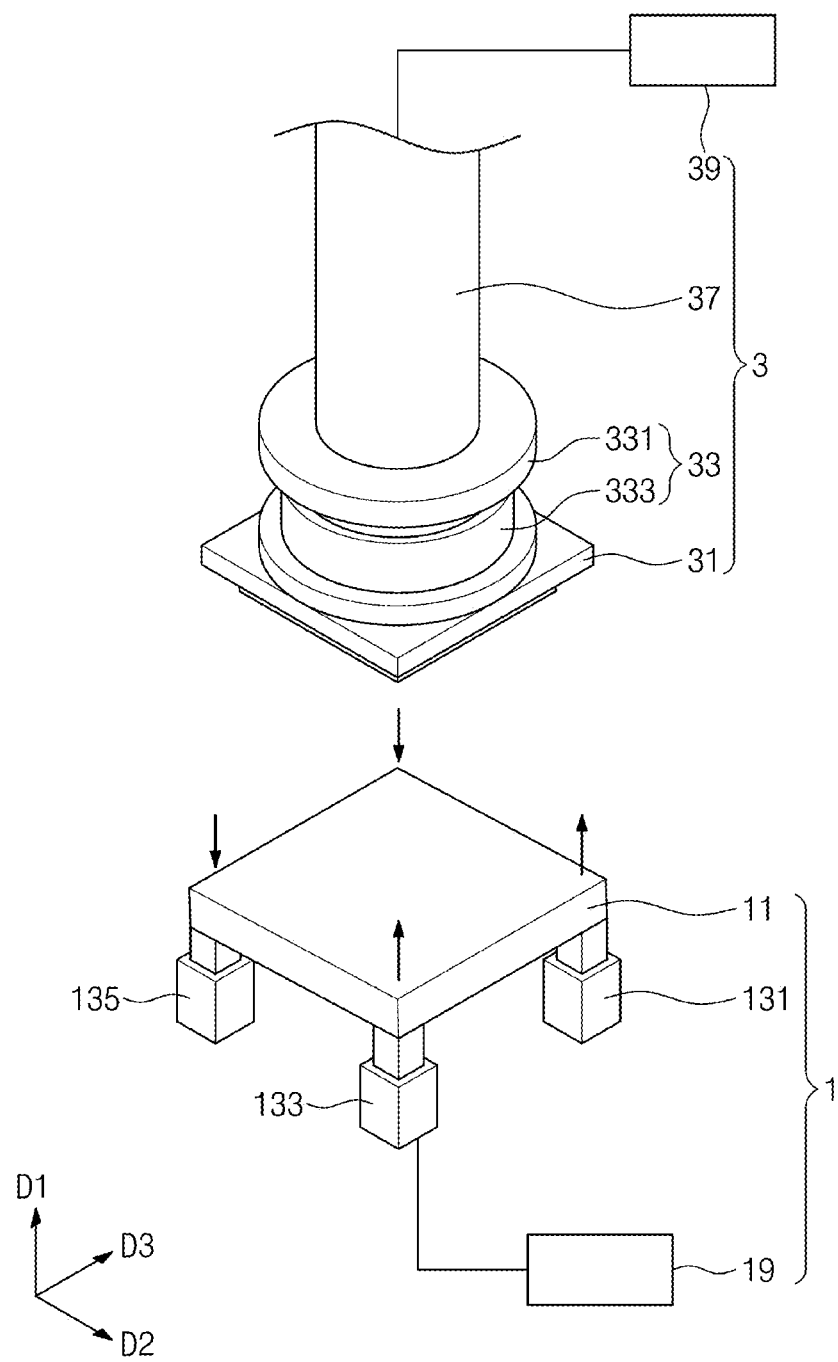

Referring to FIGS. 9, 11, and 12, the adjusting of the angle of the correction surface to the specific angle relative to the horizontal direction, using the tilting driving portion (in S21') may include adjusting the angle of the correction surface 11u to the inclination angle determined by the control unit 19. More specifically, the control unit 19 may control the tilting driving portion 13 such that the actuators have lengths different from each other. For example, the lengths of the first and second actuators 131 and 133 may be increased, whereas the lengths of the third actuator 135 and the fourth actuator (not shown) may be decreased. In the case where the lengths of the actuators are adjusted to have different values, the correction plate 11 may be slanted. Accordingly, the inclination angle of the correction surface 11u may be changed. The control unit 19 may control the tilting driving portion 13 until the correction surface 11u has the second angle β relative to the horizontal direction.

Figure 13:
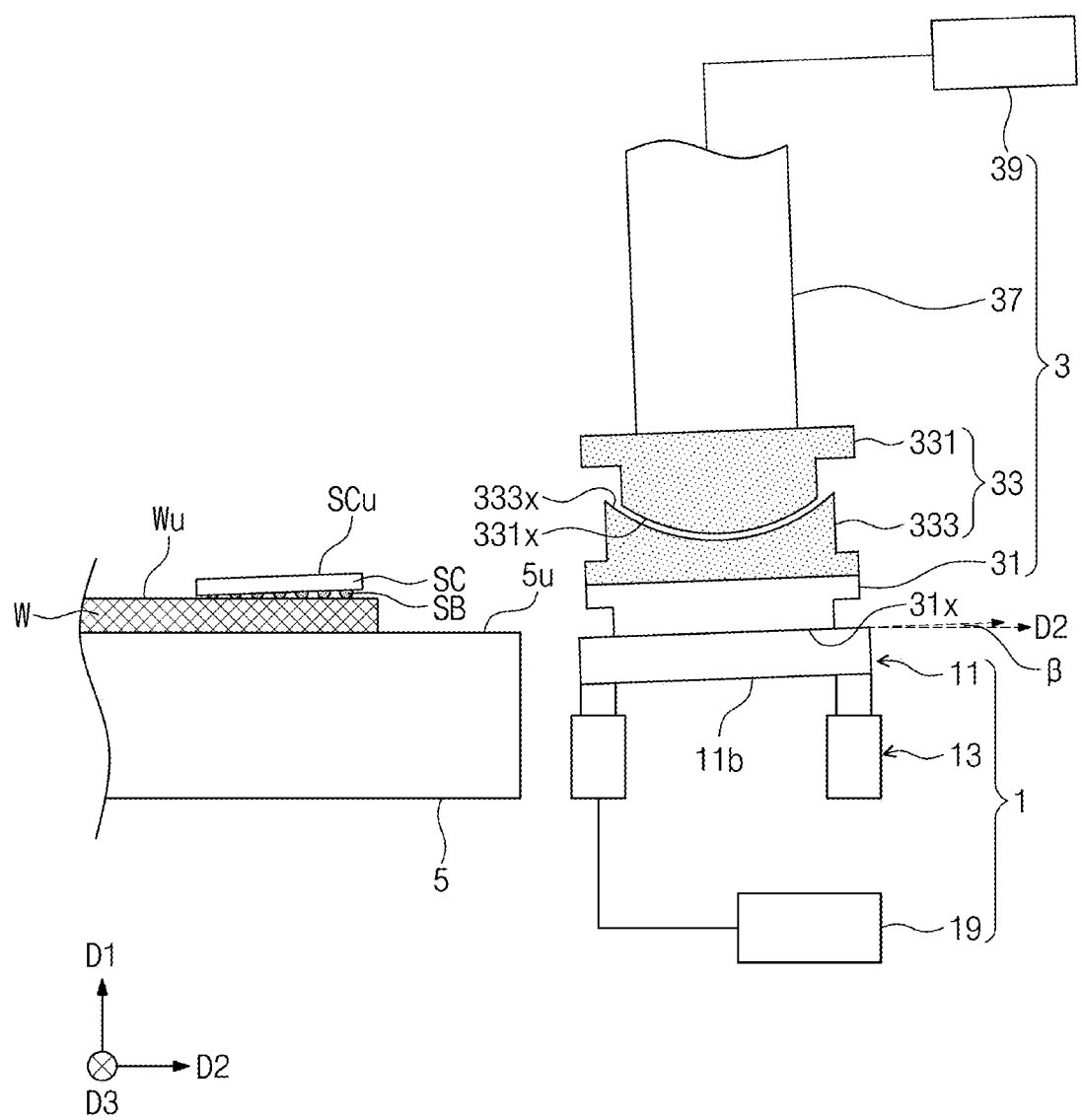

Referring to FIGS. 9 and 13, the adjusting of the angle of the suction surface to the specific angle relative to the horizontal direction (in S31') may include moving the pickup head 31 in a downward direction using the driving portion 39. If the pickup head 31 is moved in the downward direction, the suction surface 31x may be in contact with the correction surface 11u. The suction surface 31x may be rotated to have the same angle as the correction surface 11u. More specifically, if the correction surface 11u, which is aligned to have the second angle β relative to the horizontal direction, exerts an upward force on the inclined suction surface 31x, the pickup head 31 may be rotated. The rotation of the pickup head 31 may be achieved as a result of the rotation of the rotation member 333 about the fixing member 331. The downward movement of the pickup head 31 may continue until the suction surface 31x is fully in contact with the correction surface 11u. The suction surface 31x may have the same inclination angle as the correction surface 11u. In the case where the correction surface 11u is aligned to have the second angle β relative to the horizontal direction, the suction surface 31x may also be aligned to have the second angle β relative to the horizontal direction.

Figure 14:
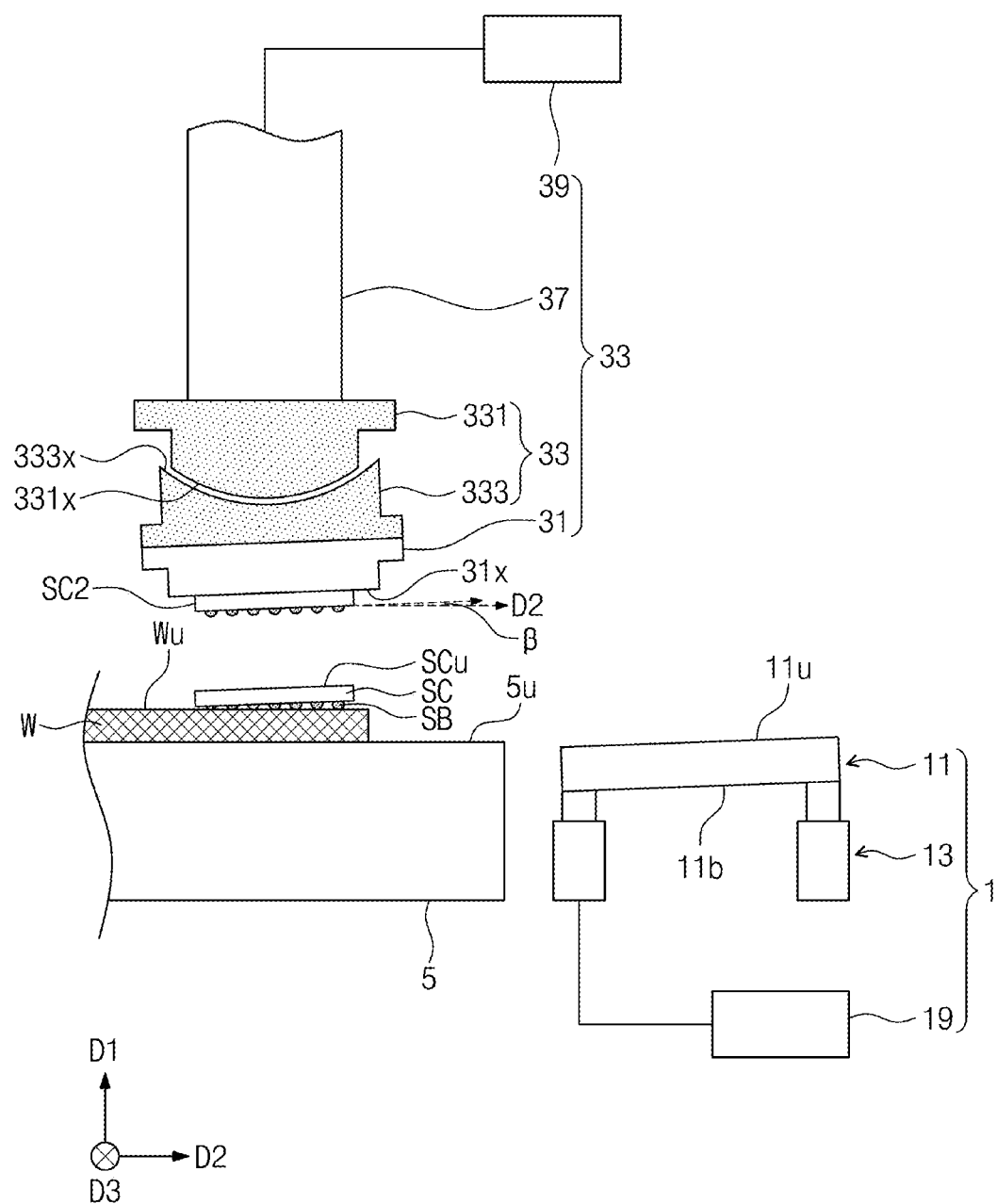
FIGS. 14 and 15 are sectional views illustrating a process of placing a semiconductor chip, using a pickup head whose inclination angle is adjusted by the method of FIG. 9.
Figure 15:
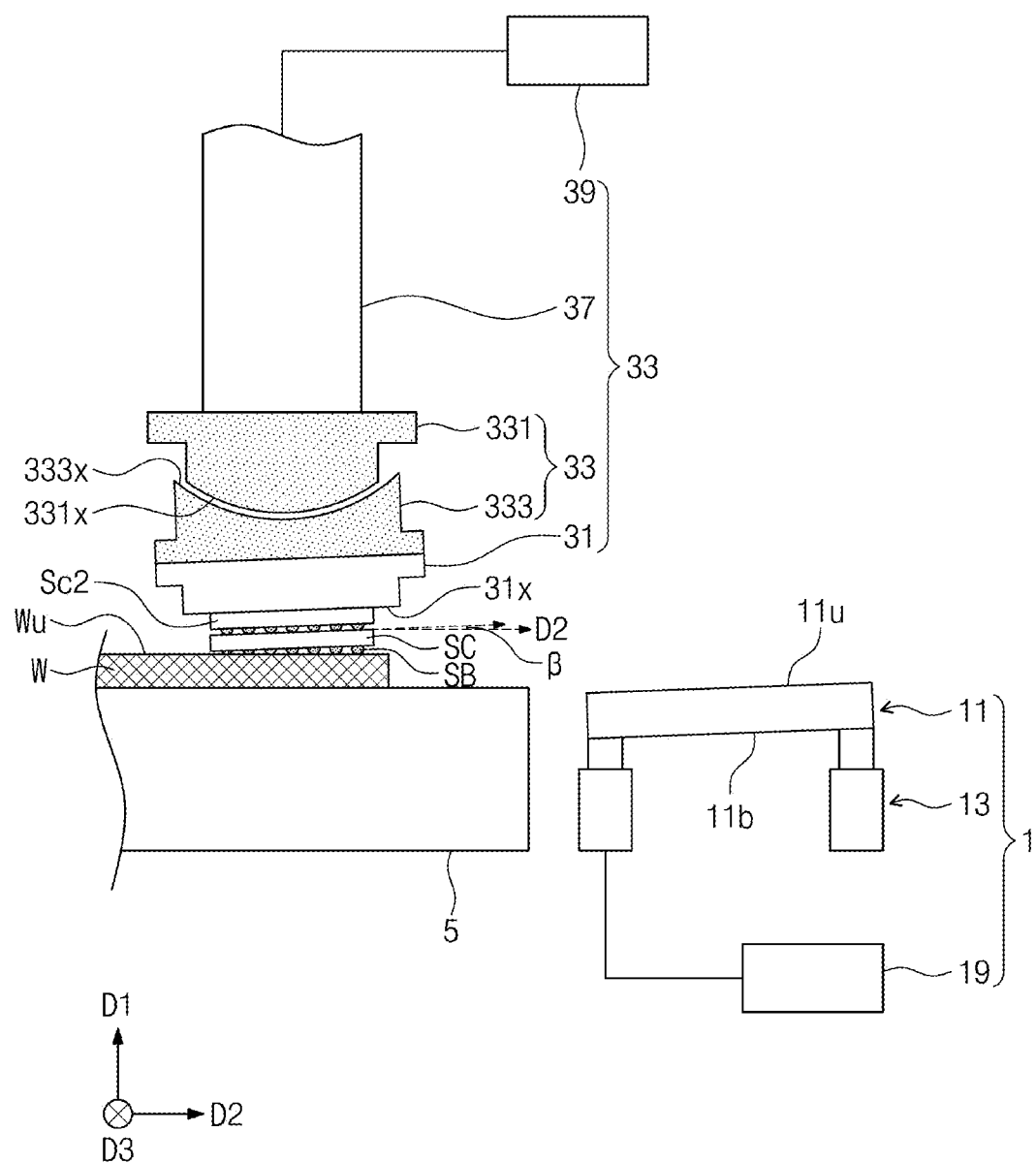

FIGS. 14 and 15 are sectional views illustrating a process of placing a semiconductor chip, using a pickup head whose inclination angle is adjusted by the method of FIG. 9.

Referring to FIG. 14, a second semiconductor chip SC2 may be caught to the suction surface 31x, which is inclined at the second angle β relative to the horizontal direction. The second semiconductor chip SC2 may also be inclined at the second angle β relative to the horizontal direction.

Referring to FIG. 15, the second semiconductor chip SC2 may be stacked on the semiconductor chip SC, which is inclined at the second angle β relative to the horizontal direction. The second semiconductor chip SC2 may have the same or similar inclination angle as the semiconductor chip SC located thereunder. For example, the semiconductor chip SC may be substantially parallel to the second semiconductor chip SC2.

In a stage structure for a semiconductor fabrication process, a chip-pickup system, and a method of controlling a tilting angle of a pickup head according to some example embodiments, it may be possible to control the pickup head to a desired inclination angle or state. For example, the pickup head may be controlled to be aligned to the horizontal direction or to be inclined at an angle relative to the horizontal direction. Thus, the pickup head may be controlled to have various inclination angles, if necessary. For example, in the case where the previously-stacked semiconductor chip is inclined as shown in FIG. 10, a semiconductor chip to be stacked thereon may be intentionally inclined to prevent or reduce the likelihood of a short circuit issue between the semiconductor chips or a non-wetting issue. Accordingly, it may be possible to improve a fabrication yield of a semiconductor package.

In a stage structure for a semiconductor fabrication process, a chip-pickup system, and a method of controlling a tilting angle of a pickup head according to some example embodiments, the tilting driving portion may be used to bring the pickup head into the horizontal state, even when, due to an uneven structure on the correction surface of the pickup head tilting control device, it is difficult to maintain the correction surface to the horizontal state. For example, the tilting driving portion may be used to adjust an inclination angle of the correction plate to an appropriate value, even when, owing to a process failure or damage occurring in a process of forming the correction surface, the correction surface is not in the horizontal state. Accordingly, the pickup head may be in the horizontal state easily.

Figure 16:
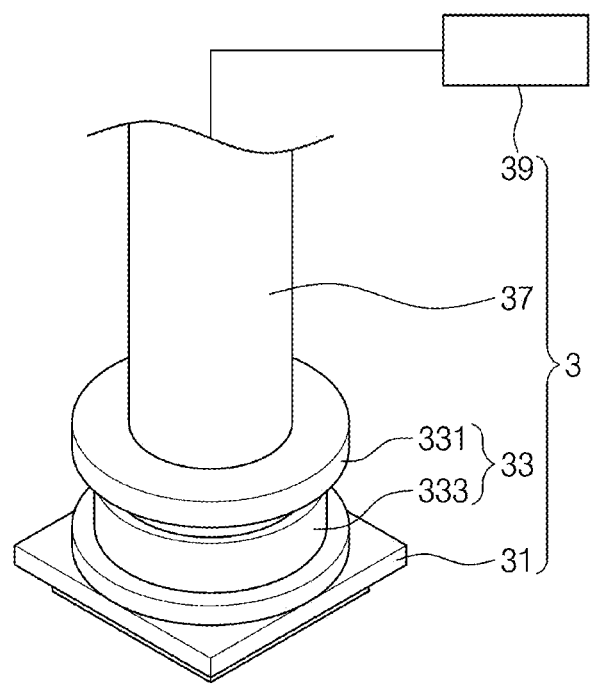
FIG. 16 is a perspective view illustrating a stage structure for a semiconductor fabrication process and a system of picking up a semiconductor chip, according to some example embodiments.
Figure 16:
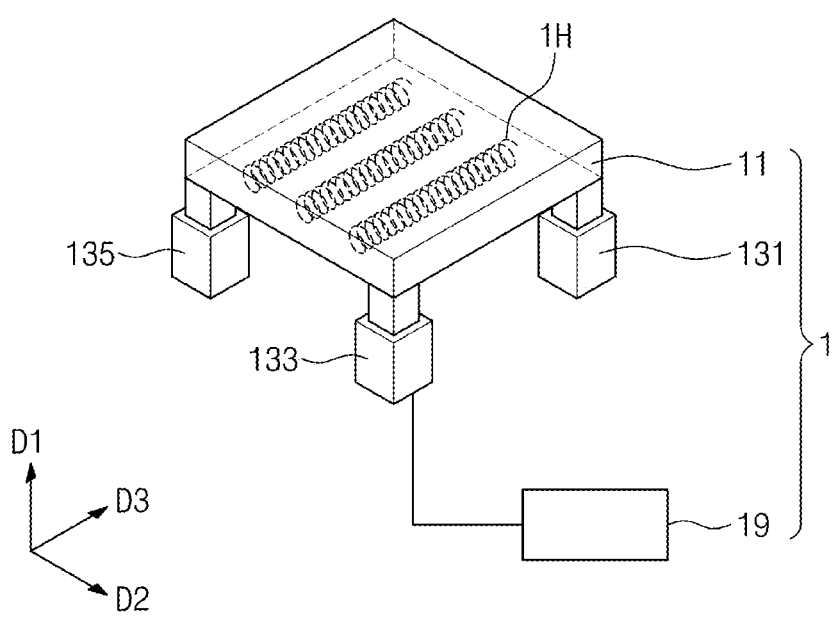

FIG. 16 is a perspective view illustrating a stage structure for a semiconductor fabrication process and a chip-pickup system, according to some example embodiments.

In the following description, the structural or method features, which are the same as or similar to those described with reference to FIGS. 1 to 15, will be omitted, for the sake of brevity.

Referring to FIG. 16, a heater 1H may be further provided in the correction plate 11. The heater 1H may be supplied with a power from the outside. A temperature of the correction plate 11 may be increased by the heater 1H. When the pickup head 31 is in contact with the correction plate 11, heat from the correction plate 11 may be provided to the pickup head 31. In some example embodiments, since the temperature of the correction plate 11 is high, it may be possible to prevent heat from being leaked from the pickup head 31 to the correction plate 11. Thus, it may be possible to prevent or reduce the likelihood of the temperature of the pickup head 31 from being lowered. Although not shown, a heater may be disposed in the stage 5 (e.g., see FIG. 15). The heater in the stage 5 may be used to increase the temperature of the stage 5.

In a stage structure for a semiconductor fabrication process, a chip-pickup system, and a method of controlling a tilting angle of a pickup head according to some example embodiments, by heating the correction plate in contact with the pickup head, it may be possible to prevent the temperature of the pickup head from being excessively changed. Accordingly, it may be easy to maintain the temperature of the pickup head and the semiconductor chip within a desired range, when a thermal-compression (TC) bonding operation is performed on the stage.

Figure 17:
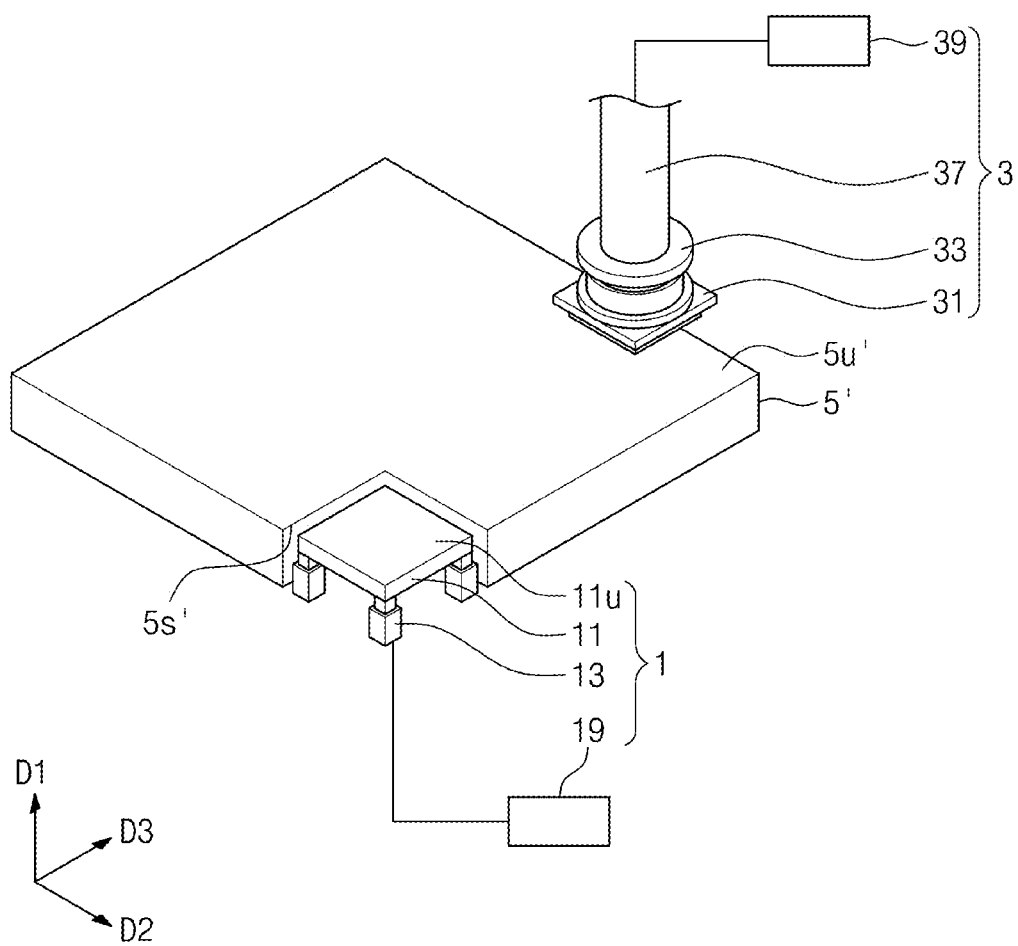
FIG. 17 is a perspective view illustrating a stage structure for a semiconductor fabrication process and a system of picking up a semiconductor chip, according to some example embodiments.

FIG. 17 is a perspective view illustrating a stage structure for a semiconductor fabrication process and a chip-pickup system, according to some example embodiments.

In the following description, the structural or method features, which are the same as or similar to those described with reference to FIGS. 1 to 16, will be omitted, for the sake of brevity.

Referring to FIG. 17, a stage 5' may provide a cut-way portion or a recess portion 5s'. The recess portion 5s' may be formed by recessing a portion of a side surface of the stage 5' in an inward direction. The recess portion 5s' may be in a corner of the stage 5'. The pickup head tilting control device 1 may be located in the recess portion 5s'. The correction plate 11 may be disposed in the recess portion 5s'.

In a stage structure for a semiconductor fabrication process, a chip-pickup system, and a method of controlling a tilting angle of a pickup head according to some example embodiments, it may be possible to reduce a total volume of the semiconductor fabrication system. For example, since the pickup head tilting control device is disposed in a recess portion provided by recessing a portion of the stage, the stage structure for a semiconductor fabrication process may have a reduced volume. Accordingly, the stage structure for a semiconductor fabrication process may be disposed in the existing chamber. Thus, a new chamber is not needed or required or desired for the stage structure for a semiconductor fabrication process, and fabrication cost is not increased.

Figure 18:
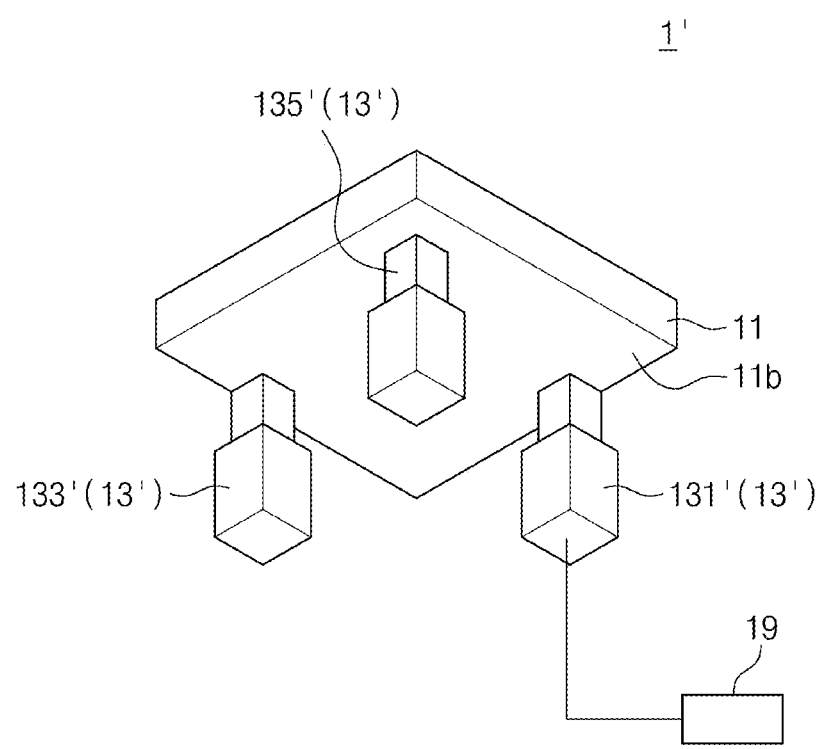
FIG. 18 is a perspective view illustrating a pickup head tilting control device, according to some example embodiments.

FIG. 18 is a perspective view illustrating a pickup head tilting control device, according to some example embodiments.

In the following description, the structural or method features, which are the same as or similar to those described with reference to FIGS. 1 to 17, will be omitted, for the sake of brevity.

Referring to FIG. 18, a tilting driving portion 13' may include only three actuators. That is, only three actuators, not four actuators, may be provided, unlike that described with reference to FIG. 2. The three actuators may be referred to as a first actuator 131', a second actuator 133', and a third actuator 135', respectively. The inclination angle of the correction plate 11 may be controlled using only the three actuators.

Figure 19:
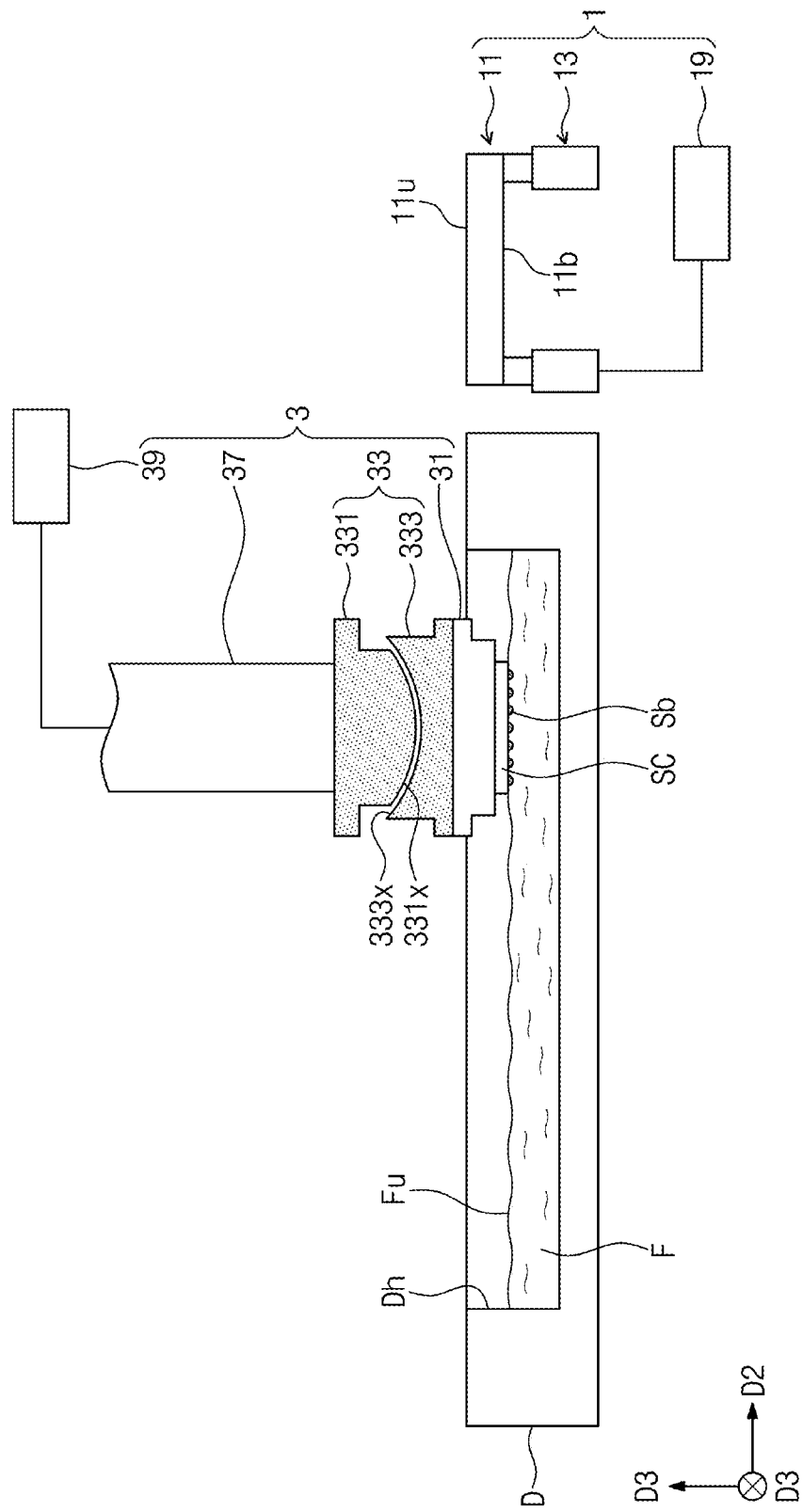
FIG. 19 is a side view illustrating a process of coating a semiconductor chip with a flux, using a system of picking up a semiconductor chip, according to some example embodiments.

FIG. 19 is a side view illustrating a process of coating a semiconductor chip with a flux, using a chip-pickup system, according to some example embodiments.

In the following description, the structural or method features, which are the same as or similar to those described with reference to FIGS. 1 to 18, will be omitted, for the sake of brevity.

Referring to FIG. 19, the pickup tool 3 may be used to coat a flux on the solder ball Sb of the semiconductor chip SC. The flux may be a material that is used to remove an oxide layer or the like from a surface of the solder ball Sb, and the use of the flux may allow the solder ball Sb to be electrically connected to another element in a more stable manner. In some example embodiments, a flux F may be contained in a containing portion Dh of a dipping device D. The pickup head 31 may be aligned to the horizontal direction by the pickup head tilting control device 1. Accordingly, the semiconductor chip SC, which is caught by the pickup head 31, may also be aligned to the horizontal direction. The pickup tool 3 may be moved in a downward direction, while maintaining the alignment state of the caught semiconductor chip SC. A portion of the solder ball Sb of the semiconductor chip SC may pass through a surface Fu of the flux F, which is contained in the dipping device D, and may be dipped into the flux F. Accordingly, the solder ball Sb may be coated with the flux F.

In a stage structure for a semiconductor fabrication process, a chip-pickup system, and a method of controlling a tilting angle of a pickup head according to some example embodiments, it may be possible to perform a flux dipping process on a solder ball in the state in which a pickup head is aligned to the horizontal direction. Thus, all solder balls may be uniformly coated with a flux. This may make it possible to prevent or suppress a short circuit issue or a non-wetting issue from occurring in some of the solder balls.

Accordingly, it may be possible to improve a fabrication yield of a semiconductor package.

In a stage structure for a semiconductor fabrication process, a chip-pickup system, and a method of controlling a tilting angle of a pickup head according to some example embodiments, a suction surface of a pickup head may be controlled to be aligned to a horizontal direction.

In a stage structure for a semiconductor fabrication process, a chip-pickup system, and a method of controlling a tilting angle of a pickup head according to some example embodiments, the suction surface of the pickup head may be controlled to have various angles.

In a stage structure for a semiconductor fabrication process, a chip-pickup system, and a method of controlling a tilting angle of a pickup head according to some example embodiments, it may be possible to improve a fabrication yield of a semiconductor package.

In a stage structure for a semiconductor fabrication process, a chip-pickup system, and a method of controlling a tilting angle of a pickup head according to some example embodiments, it may be possible to variously adjust an angle of the suction surface of the pickup head, even when the existing stage is used.

In a stage structure for a semiconductor fabrication process, a chip-pickup system, and a method of controlling a tilting angle of a pickup head according to some example embodiments, it may be possible to facilitate a manufacturing process.

In a stage structure for a semiconductor fabrication process, a chip-pickup system, and a method of controlling a tilting angle of a pickup head according to some example embodiments, it may be possible to precisely perform a bonding process on a solder ball of a fine pitch.

Any or all of the elements disclosed above may include or be implemented as components of a robot such as a mechanical robot. Such components may be or may include, but are not limited to, manipulators and/or joints and/or links and/or arms such as arms equipped with zero or more actuators such as linear actuators and/or rotary actuators, power supplies such as hydraulic and/or pneumatic and/or electric power supplies, sensors such as tactile sensors and/or vision sensors, motors/engines, processing circuitry and/or control circuitry, amplifiers, transducers, etc.

Any or all of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments of the inventive concept have been particularly shown and described, it will be understood by one of ordinary skill in the art that variations in form and detail may be made therein without departing from the spirit and scope of the attached claims.

What is claimed is:

1. A stage structure for a semiconductor fabrication process, comprising:
    a stage; and
    a pickup head tilting control device,
    wherein the pickup head tilting control device comprises;
    an inclination correction plate,
    a tilting driver, coupled to the inclination correction plate and configured to adjust an inclination angle of the inclination correction plate, and
    a control processing circuitry configured to control the tilting driver;
    wherein the inclination correction plate comprises a correction surface which is selectively in contact with a suction surface of a pickup head,
    wherein the pickup head is configured to selectively contact the correction surface by moving downwardly to fully contact the inclination correction plate, and
    the tilting driver of the pickup head tilting control device is configured to adjust the inclination angle of the inclination correction plate to change an inclination angle of the suction surface in response to the inclination correction plate contacting the suction surface.

2. The stage structure of claim 1, wherein the tilting driver comprises a vertically extendible actuator,
    the actuator is coupled to a supporting surface which is opposite to the correction surface, and
    the control circuitry is configured to change a length of the actuator.

3. The stage structure of claim 2, wherein the actuator comprises a Piezo actuator.

4. The stage structure of claim 2, wherein a number of the actuator provided in the tilting driver is three or more.

5. The stage structure of claim 1, wherein the inclination correction plate comprises at least one of ceramic materials and metallic materials.

6. The stage structure of claim 1, wherein the stage has a recess portion defined by a partially recessed side surface, and
    the inclination correction plate is in the recess portion.

7. The stage structure of claim 1, further comprising
    a measurement sensor, which is placed above the stage and is configured to measure an inclination angle of a semiconductor chip on the stage,
    wherein the control circuitry is configured to control the tilting driver, based on information obtained by the measurement sensor.

8. The stage structure of claim 1, further comprising a heater in the inclination correction plate.

9. The stage structure of claim 1, wherein the correction surface is at a same level as a top surface of the stage.

10. The stage structure of claim 1, wherein the stage is separate from the pickup head tilting control device.

11. The stage structure of claim 1, wherein the inclination angle of the inclination correction plate is a horizontal inclination angle.

12. The stage structure of claim 1, wherein the pickup head tilting control device is at one of an edge of the stage or a corner of the stage.

13. The stage structure of claim 1, wherein the suction surface of the pickup head is configured to attach to a semiconductor chip.

14. The stage structure of claim 13, wherein the pickup head includes a ball-and-socket joint, and the pickup head is configured to attach to a surface of the ball-and-socket joint.

15. The stage structure of claim 1, further comprising:
    a second pickup head tilting control device, wherein the second pickup head tilting control device is at a side of the stage other than a side of the stage where the pickup head tilting control device is located.

16. The stage structure of claim 1, wherein the correction surface is configured to impart an upward force on the suction surface such that the pickup head is rotated.

* * * * *